(12) United States Patent
Das et al.

(10) Patent No.: US 8,607,445 B1
(45) Date of Patent: Dec. 17, 2013

(54) SUBSTRATE HAVING INTERNAL CAPACITOR AND METHOD OF MAKING SAME

(75) Inventors: Rabindra N. Das, Vestal, NY (US);
Frank D. Egitto, Binghamton, NY (US);
John M. Lauffer, Waverly, NY (US);
How T. Lin, Vestal, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 0 days.

(21) Appl. No.: 13/517,776

(22) Filed: Jun. 14, 2012

Related U.S. Application Data

(63) Continuation-in-part of application No. 11/878,673, filed on Jul. 26, 2007, now abandoned, which is a continuation-in-part of application No. 11/730,761, filed on Apr. 4, 2007, which is a continuation-in-part of application No. 11/352,279, filed on Feb. 13, 2006, now Pat. No. 7,449,381, which is a continuation-in-part of application No. 11/172,794, filed on Jul. 5, 2005, now Pat. No. 7,384,856, which is a continuation-in-part of application No. 11/031,085, filed on Jan. 10, 2005, now Pat. No. 7,541,265.

(51) Int. Cl.
*H05K 3/30* (2006.01)

(52) U.S. Cl.
USPC .............. 29/832; 29/846; 29/852; 29/25.42; 361/321.2

(58) Field of Classification Search
USPC .................. 29/830–832, 592.1, 601, 25.03, 29/25.41–25.42; 361/320–321.6, 306; 174/250, 260–262
See application file for complete search history.

(56) References Cited

U.S. PATENT DOCUMENTS

| | | | |
|---|---|---|---|
| 4,945,399 A | 7/1990 | Brown et al. |
| 5,027,253 A | 6/1991 | Lauffer et al. |
| 5,079,069 A | 1/1992 | Howard et al. |
| 5,162,977 A | 11/1992 | Paurus et al. |
| 5,796,587 A | 8/1998 | Lauffer et al. |
| 5,972,053 A | 10/1999 | Hoffarth et al. |
| 6,068,782 A | 5/2000 | Brandt et al. |
| 6,150,456 A | 11/2000 | Lee et al. |
| 6,207,595 B1 | 3/2001 | Appelt et al. |
| 6,215,649 B1 | 4/2001 | Appelt et al. |
| 6,256,850 B1 | 7/2001 | Lauffer et al. |
| 6,274,224 B1 | 8/2001 | O'Bryan et al. |
| 6,343,001 B1 | 1/2002 | Japp et al. |
| 6,370,012 B1 | 4/2002 | Adae-Amoakoh et al. |
| 6,395,996 B1 | 5/2002 | Tsai et al. |
| 6,446,317 B1 | 9/2002 | Figueroa et al. |
| 6,496,356 B2 | 12/2002 | Japp et al. |

(Continued)

*Primary Examiner* — Minh Trinh

(74) *Attorney, Agent, or Firm* — Mark Levy; Hinman, Howard & Kattell, LLP

(57) ABSTRACT

A method of making a circuitized substrate which includes at least one and possibly several capacitors as part thereof. In one embodiment, the substrate is produced by forming a layer of capacitive dielectric material on a dielectric layer and thereafter forming channels with the capacitive material, e.g., using a laser. The channels are then filled with conductive material, e.g., copper, using selected deposition techniques, e.g., sputtering, electro-less plating and electroplating. A second dielectric layer is then formed atop the capacitor and a capacitor "core" results. This "core" may then be combined with other dielectric and conductive layers to form a larger, multilayered PCB or chip carrier. In an alternative approach, the capacitive dielectric material may be photo-imageable, with the channels being formed using conventional exposure and development processing known in the art.

19 Claims, 5 Drawing Sheets

(56) References Cited

U.S. PATENT DOCUMENTS

| | | |
|---|---|---|
| 6,524,352 B2 | 2/2003 | Adae-Amoakoh et al. |
| 6,542,379 B1 | 4/2003 | Lauffer et al. |
| 6,574,090 B2 | 6/2003 | Appelt et al. |
| 6,616,794 B2 | 9/2003 | Hartman et al. |
| 6,625,857 B2 | 9/2003 | Appelt et al. |
| 6,638,378 B2 | 10/2003 | O'Bryan et al. |
| 6,704,207 B2 | 3/2004 | Kopf |
| 6,739,027 B1 | 5/2004 | Lauffer et al. |
| 6,815,085 B2 | 11/2004 | Appelt et al. |
| 7,025,607 B1 | 4/2006 | Das et al. |
| 7,064,412 B2 | 6/2006 | Geissinger et al. |
| 7,384,856 B2 | 6/2008 | Das et al. |
| 7,449,381 B2 | 11/2008 | Das et al. |
| 7,541,265 B2 | 6/2009 | Das et al. |
| 7,687,722 B2 | 3/2010 | Japp et al. |
| 7,870,664 B2 * | 1/2011 | Das et al. .................. 29/832 |
| 8,144,480 B2 * | 3/2012 | Das et al. .................. 361/766 |
| 8,302,270 B2 * | 11/2012 | Kim et al. .................. 29/25.42 |
| 2007/0177331 A1 | 8/2007 | Das et al. |

* cited by examiner

SUBSTRATE HAVING INTERNAL CAPACITOR AND METHOD OF MAKING SAME

RELATED PATENTS AND PATENT APPLICATIONS

The present application is a continuation-in-part application of U.S. patent application Ser. No. 11/878,673, now abandoned, which is a continuation-in-part of pending U.S. patent application Ser. No. 11/730,761, which is a continuation-in-part of U.S. Pat. No. 7,449,381 (U.S. patent application Ser. No. 11/352,279), which in turn is a continuation-in-part application of U.S. Pat. No. 7,384,856 (U.S. patent application Ser. No. 11/172,794), which still further in turn is a continuation-in-part application of U.S. Pat. No. 7,541,265 (U.S. patent application Ser. No. 11/031,085).

All of the above applications are assigned to the same Assignee as the present invention.

In U.S. Pat. No. 7,541,265, entitled CAPACITOR MATERIAL FOR USE IN CIRCUITIZED SUBSTRATES, CIRCUITIZED SUBSTRATE UTILIZING SAME, METHOD OF MAKING SAID CIRCUITIZED SUBSTRATE, AND INFORMATION HANDLING SYSTEM UTILIZING SAID CIRCUITIZED SUBSTRATE and issued Jun. 2, 2009, there is defined a material for use as part of an internal capacitor within a circuitized substrate wherein the material includes a polymer (e.g., a cycloaliphatic epoxy or phenoxy based) resin and a quantity of nano-powders of ferroelectric ceramic material (e.g., barium titanate) having a particle size substantially in the range of from about 0.01 microns to about 0.90 microns and a surface area for selected ones of these particles within the range of from about 2.0 to about 20 square meters per gram. A circuitized substrate adapted for using such a material and capacitor therein and a method of making such a substrate are also defined. An electrical assembly (substrate and at least one electrical component) and an information handling system (e.g., personal computer) are also defined.

In the examples discussed in U.S. Pat. No. 7,541,265, epoxy resin is mixed with hexahydro-4-methylphthalic anhydride, N,N dimethyl benzylamine and epoxy novolac resin. The mixed solution was stirred and barium titanate powder was added and formed into a screen printable paste. A layer of this material was screened through a 200 mesh screen onto the top surface of a copper first electrical conductor. This layer was then cured at approximately 150 degrees C. for about two hours, followed by an additional cure at approximately 190 degrees C. for about one hour. The second electrical conductor was then formed using a sputtering operation followed by a copper electroplating process and a photolithographic etch step.

In U.S. Pat. No. 7,384,856, entitled METHOD OF MAKING AN INTERNAL CAPACITIVE SUBSTRATE FOR USE IN A CIRCUITIZED SUBSTRATE AND METHOD OF MAKING SAID CIRCUITIZED SUBSTRATE and issued Jun. 10, 2008, there is defined a method of forming a capacitive substrate in which first and second conductors are formed opposite a dielectric, with one of these electrically coupled to a thru-hole connection. Each functions as an electrode for the resulting capacitor. The substrate is then adapted for being incorporated within a larger structure to form a circuitized substrate such as a printed circuit board or a chip carrier. Additional capacitors are also possible.

In one of the examples (Example 5) cited in U.S. Pat. No. 7,384,856, epoxy novolac resin and a phenoxy resin are mixed together with barium titanate ($BaTiO_3$) powder and propylene glycol monomethyl ether acetate and methyl ethyl ketone and ball milled for three days. A 2.5 micron thin film of this mixed composite was deposited on a copper substrate and dried at approximately 140 degrees C. for three minutes in an oven to remove residual organic solvents. This was followed by curing in an oven at 190 degrees C. for two hours. A second electrical conductor was then formed using a sputtering operation atop the cured film using a mask normally used for such sputtering operations.

In U.S. Pat. No. 7,449,381, entitled METHOD OF MAKING A CAPACITIVE SUBSTRATE FOR USE AS PART OF A LARGER CIRCUITIZED SUBSTRATE, METHOD OF MAKING SAID CIRCUITIZED SUBSTRATE AND METHOD OF MAKING AN INFORMATION HANDLING SYSTEM INCLUDING SAID CIRCUITIZED SUBSTRATE and issued Nov. 11, 2008, there is defined a method of forming a capacitive substrate in which at least one capacitive dielectric layer of material is screen or ink jet printed onto a conductor and the substrate is thereafter processed further, including the addition of thru-holes to couple selected elements within the substrate to form at least two capacitors as internal elements of the substrate. Photoimageable material is used to facilitate positioning of the capacitive dielectric being printed. The capacitive substrate may be incorporated within a larger circuitized substrate, e.g., to form an electrical assembly. A method of making an information handling system including such substrates is also provided. The capacitive substrate may be incorporated within a larger circuitized substrate, e.g., to form an electrical assembly. A method of making an information handling system including such substrates is also provided.

As in Example 5 of U.S. Pat. No. 7,384,856, epoxy novolac resin and a phenoxy resin are mixed together with barium titanate ($BaTiO_3$) powder and propylene glycol monomethyl ether acetate and methyl ethyl ketone and ball milled for three days. A 2.5 micron thin film of this mixed composite was then deposited on a copper substrate and dried at approximately 140 degrees C. for three minutes in an oven to remove residual organic solvents. This was followed by curing in an oven at 190 degrees C. for two hours. A second electrical conductor was then formed using a sputtering operation atop the cured film using a mask normally used for such sputtering operations.

In U.S. Pat. No. 7,687,722, entitled HALOGEN-FREE CIRCUITIZED SUBSTRATE WITH REDUCED THERMAL EXPANSION, METHOD OF MAKING SAME, MULTILAYERED SUBSTRATE STRUCTURE UTILIZING SAME, AND INFORMATION HANDLING SYSTEM UTILIZING and issued Mar. 30, 2010, there is defined a circuitized substrate including a composite layer comprising a first dielectric sub-layer comprised of a halogen-free resin and fibers dispersed therein and a second dielectric sub-layer without fibers but also including a halogen-free resin with inorganic particulates therein. A method of making such a substrate is also provided, as is a multilayered assembly including one or more such circuitized substrates, possibly in combination with other substrates. An information handling system designed for having one or more such circuitized substrates is also provided.

In United States Patent Publication No. 2007/0177331, entitled NON-FLAKING CAPACITOR MATERIAL, CAPACITIVE SUBSTRATE HAVING AN INTERNAL CAPACITOR THEREIN INCLUDING SAID NON-FLAKING CAPACITOR MATERIAL, AND METHOD OF MAKING A CAPACITOR MEMBER FOR USE IN A CAPACITIVE SUBSTRATE and filed on Apr. 4, 2007, there is defined a capacitor material including a thermosetting resin (e.g., epoxy resin), a high molecular mass flexibilizer (e.g., phenoxy resin), and a quantity of nano-particles of a ferroelectric ceramic material (e.g., barium titanate), the capacitor material not including continuous or semi-continuous fibers (e.g., fiberglass) as part thereof. The material is adapted for being positioned in layer form on a first conductor member and heated to a predetermined temperature whereupon the material will not possess any substantial flaking characteristics. A second conductor member may then be positioned on the material to form a capacitor member, which then may be incorporated within a substrate to form a capacitive substrate. Electrical components may be positioned on the substrate and capacitively coupled to the internal capacitor. The capacitor material as defined in this application may be used in the present invention.

FIELD OF THE INVENTION

The present invention relates to methods of making circuitized substrates having one or more internal capacitors as part thereof.

BACKGROUND OF THE INVENTION

Printed circuit boards (hereinafter also referred to as PCBs), chip carriers, and the like (all referred to herein as "circuitized substrates") are typically produced in laminate form in which several layered dielectric and conductive material members (laminates) are bonded together using conventional lamination processing involving relatively high temperatures and pressures. The conductive layers, typically of thin copper, are usually used in the formed substrate for providing electrical connections to and among various devices located on the surface of the substrate, examples of such devices being integrated circuits (semiconductor chips) and discrete passive devices, such as capacitors, resistors, inductors, and the like. Typically, these discrete passive devices occupy a high percentage of the surface area of the completed multi-layered substrate, which is obviously undesirable from a future design perspective due to the ever-present demand for miniaturization.

There have been various efforts to include multiple functions (e.g. resistors, capacitors and the like) within a single component adapted for being mounted on a substrate (e.g., PCB) in an attempt to increase the available upper substrate surface area (also often referred to as "real estate"). When passive devices are in such a configuration, these are often referred to collectively and individually as integral passive devices or the like, meaning that the functions are integrated into the singular component. Because of such external positioning, these components still utilize, albeit less than if in singular form, valuable board "real estate." In response, there have been efforts to embed discrete passive components within the board. When so positioned, such components are also referred to as "embedded" passive components. A capacitor designed for disposition within (between selected layers of) a PCB (board) substrate may thus be referred to as an embedded integral passive component, or, more simply, an embedded capacitor. Such a capacitor thus provides internal capacitance. The result of this internal positioning is that it is unnecessary to also position such devices externally on the PCB's outer surface(s), thus saving valuable PCB real estate.

For an established capacitor area, two approaches are known for increasing the planar capacitance (capacitance/area) of an internal capacitor. In one such approach, higher dielectric constant materials can be used, while in a second, the thickness of the dielectric can be reduced. These constraints are reflected in the following formula, known in the art, for capacitance per area:

$$C/A = (\text{Dielectric Constant of Laminate} \times \text{Dielectric Constant in Vacuum} / \text{Dielectric Thickness})$$

where: C is the capacitance and A is the capacitor's area. Additional formulae are provided herein with respect to defining capacitance values for the structures formed herein.

As mentioned above, there have been previous attempts to provide internal capacitance and other internal conductive structures, components or devices (one good example being internal semiconductor chips) within circuitized substrates such as PCBs, some of these including the use of nano-powders. The cited U.S. Pat. Nos. 7,541,265 and 7,384,856 also define such approaches. The following documents also describe examples of such attempts, including some which discuss using nano-powders and those using alternative measures. Further, some of the patents listed below, and some of the pending applications cited above, mention the use of various materials for providing desired capacitance levels. With respect to the following patents, some mention or suggest problems associated with the methods and resulting materials used to do so.

In U.S. Pat. No. 7,064,412, entitled ELECTRONIC PACKAGE WITH INTEGRATED CAPACITOR and issued on Jun. 20, 2006, there is described an electronic package including a conductive trace layer having a first side and a second side. The conductive trace layer is patterned to define a plurality of interconnect pads. A flexible dielectric substrate is mounted on the first side of the conductive trace layer. A flexible capacitor including a first conductive layer, a second conductive layer and a layer of dielectric material disposed between the first and the second conductive layers is mounted with the first conductive layer adjacent the second side of the conductive trace layer. The first conductive layer of the capacitor is electrically connected to a first set of the interconnect pads and the second conductive layer of the capacitor is electrically connected to a second set of the interconnect pads. In this patent, a copper foil, or other conductive substrate, which may have material present on its surface such as an organic anti-corrosion agent (for example, a benzotriazole derivative) and residual oils from a rolling process, preferably, has a thickness of less than about 100 microns. The copper foil is subjected to a surface treatment to ensure adhesion between the dielectric layer and layers of copper foil. A blend of dielectric material may be prepared by providing a resin such as epoxy, optionally including dielectric or insulating particles such as barium titanate, and optionally including a catalyst for the epoxy. Absorbed water or residual materials on the particles, e.g., carbonates resulting from the manufacturing process, can be removed from the surface of the particles before use by heating the particles in air at a particular temperature for a period of time, for example, 350 degrees Celsius (also referred to herein at many locations simply as C) for fifteen hours. The blend of barium titanate particles and epoxy is prepared by mixing together barium titanate, a solvent solution of epoxies, e.g. ketone, and a dispersing agent. A high shear rotor-stator mixer (6000 rpm) with a water/ice bath is used, while ball-milling is another method. The blend is allowed to sit undisturbed allowing agglomerates to settle to the bottom of the container. The settling is allowed to occur for about twelve hours or more. As a final filtration step, the blend is then filtered, for example, through a stainless steel mesh filter or equivalent having a mesh size of from about two micrometers to about five micrometers. The blend may be coated onto the copper in a solvent system or solvent may be omitted if the organic binder is a liquid with sufficiently low viscosity to enable coating.

In U.S. Pat. No. 7,025,607, entitled CAPACITOR MATERIAL WITH METAL COMPONENT FOR USE IN CIRCUITIZED SUBSTRATES, CIRCUITIZED SUBSTRATE UTILIZING SAME, METHOD OF MAKING SAID CIRCUITIZED SUBSTRATE, AND INFORMATION HANDLING SYSTEM UTILIZING SAID CIRCUITIZED SUBSTRATE and issue Apr. 11, 2006, there is defined a material for use as part of an internal capacitor within a circuitized substrate in which the material includes a polymer resin and a quantity of nano-powders including a mixture of at least one metal component and at least one ferroelectric ceramic component, the ferroelectric ceramic component nano-particles having a particle size substantially in the range of between about 0.01 microns and about 0.9 microns and a surface within the range of from about 2.0 to about 20 square meters per gram. A circuitized substrate adapted for using such a material and capacitor therein and a method of making such a substrate are also defined. An electrical assembly (substrate and at least one electrical component) and an information handling system (e.g., personal computer) are also defined. U.S. Pat. No. 7,025,607 is assigned to the same Assignee as the present invention.

In U.S. Pat. No. 6,815,085, entitled PRINTED CIRCUIT BOARD CAPACITOR STRUCTURE AND METHOD and issued Nov. 9, 2004, there is described a capacitive element for a circuit board or chip carrier which is formed from a pair of conductive sheets having a dielectric component laminated there-between. The dielectric component is formed from two or more dielectric sheets, at least one of which can be partially cured followed by being fully cured. The partially cured sheet is laminated to at least one other sheet of dielectric material and one of the sheets of conductive material. The total thickness of the two sheets of the dielectric component does not exceed about four mils and preferably does not exceed about three mils. The use of two or more sheets of dielectric material makes it very unlikely that two or more defects in the sheets of dielectric material will align, thus greatly reducing the probability of a defect causing a failure in test or field use. In this patent, a pair of copper sheets are coated each on one side thereof with a dielectric material which may be epoxy or other type of dielectric material such as a cyanate ester, a polyimide, or polytetrafluoroethlyene (PTFE). The dielectric materials, other than the impregnated glass cloth, may be applied as liquids or, in the case of polyimide and PTFE, be in the form of free standing films of material. The material is partially cured or, in the case of films or glass cloth, may be applied to the copper in the partially cured form. The sheets of copper with the dielectric material thereon are laminated together to form a structure comprised of two sheets of copper separated by two sheets of fully cured dielectric material.

In U.S. Pat. No. 6,739,027, entitled METHOD FOR PRODUCING PRINTED CIRCUIT BOARD WITH EMBEDDED DECOUPLING CAPACITANCE and issued May 25, 2004, there is described a method for producing a capacitor to be embedded in an electronic circuit package comprising the steps of selecting a first conductor foil, selecting a dielectric material, coating the dielectric material on at least one side of the first conductor foil, and layering the coated foil with a second conductor foil on top of the coating of dielectric material. Also claimed is an electronic circuit package incorporating at least one embedded capacitor manufactured in accordance with the present invention. In this patent, pre-drilled or pre-etched copper conductor foils that have been coated with a dielectric material are in the form of voltage or ground planes. After coating with dielectric material, these are stacked up in alternate fashion (i.e. voltage/ground/voltage) and laminated together with other signal planes to create a final multi-layer circuit board. Other suitable conductor foils include copper-Invar-copper, Invar, aluminum, and copper pre-laminated to a dielectric. The dielectric coating may be standard liquid epoxy, polyimide, Teflon, cyanate resins, powdered resin materials, or filled resin systems exhibiting enhanced dielectric constants. Coating of the dielectric material onto the copper foil may be performed using roller, draw, powder or curtain coating, electrostatic or electrophoretic deposition, screen printing, spraying, dipping or transfer of a dry film. Once multi-layer laminated, the thickness of these coated films is not limited by a glass cloth material.

In U.S. Pat. No. 6,704,207, entitled DEVICE AND METHOD FOR INTERSTITIAL COMPONENTS IN A PRINTED CIRCUIT BOARD and issued Mar. 9, 2004, there is described a printed circuit board (PCB) which includes a first layer having first and second surfaces, with an above-board device (e.g., an ASIC chip) mounted thereon. The PCB includes a second layer having third and fourth surfaces. One of the surfaces can include a recessed portion for securely holding an interstitial component. A "via", electrically connecting the PCB layers, is also coupled to a lead of the interstitial component. The described interstitial components include components such as diodes, transistors, resistors, capacitors, thermocouples, and the like. In what appears to be the preferred embodiment, the interstitial component is a resistor having a similar size to a "0402" resistor which has a thickness of about 0.014 inches.

In U.S. Pat. No. 6,638,378, entitled PASSIVE ELECTRICAL ARTICLE, CIRCUIT ARTICLES THEREOF, AND CIRCUIT ARTICLES COMPRISING A PASSIVE ELECTRICAL ARTICLE and issued on Oct. 28, 2003, there is described a passive electrical article comprising (a) a first self-supporting substrate having two opposing major surfaces, (b) a second self-supporting substrate having two opposing major surfaces, and (c) an electrically insulating or electrically conducting layer comprising a polymer and having a thickness ranging from about 0.5 to about 10 microns between the first and second substrate, wherein a major surface of the first substrate in contact with the layer and a major surface of the second substrate in contact with the layer have an average surface roughness ranging from about ten to about 300 nm and wherein a force required to separate the first and second substrates of the passive electrical article at a ninety degree peel angle is greater than about three pounds/inch (about 0.5 kN/m). Suitable resins for the electrically insulating or electrically conductive layer, which can be used to form a capacitor or a resistor, include epoxy, polyimide, polyvinylidene fluoride, benzocyclobutene, polynorbornene, polytetrafluoroethylene, acrylates, and blends thereof. Commercially available epoxies include those available from Shell Chemical Company, Houston, Tex., under the trade designation "Epon 1001F" and "Epon 1050." Preferably, the resin can withstand a temperature that would be encountered in a typical solder reflow operation, for example, in the range of about 180 to about 290 degrees C. These resins may be dried or cured to form the electrically insulating or electrically conducting layer. Dielectric or insulating particles include barium titanate, barium strontium titanate, titanium oxide, lead zirconium titanate, and mixtures thereof. A commercially available barium titanate is available from Cabot Performance Materials, Boyertown, Pa., under the trade designation "BT-8". Conductive particles may comprise conductive or semiconductive materials such as metal or metal alloy particles where the metal may be silver, nickel, or gold; nickel-coated polymer spheres; gold-coated polymer spheres (commercially available from JCI USA Inc., New York, N.Y., under product designation number "20 GNR4.6-EH"); graphite tantalum nitrides; tantalum oxynitride; doped silicon; silicon carbide; and metal silicon nitrides.

In U.S. Pat. No. 6,625,857, entitled METHOD OF FORMING A CAPACITIVE ELEMENT and issued Sep. 30, 2003, there is described a method of forming a capacitive element for a circuit board or chip carrier. The element is formed from a pair of conductive sheets having a dielectric component laminated there-between. The dielectric component is formed of two or more dielectric sheets, at least one of which can be partially cured followed by being fully cured. The lamination takes place by laminating a partially cured sheet to at least one other sheet of dielectric material and one of the conductive sheets. The total thickness of the two sheets of the dielectric component does not exceed about four mils and preferably does not exceed about three mils; thus, the single dielectric sheet does not exceed about two mils and preferably does not exceed about 1.5 mils. The conducting sheets are preferably copper, e.g., either 0.5 ounce or 1.0 ounce copper sheets. The sheets preferably have one surface roughened to improve adhesion to other materials. A pair of dielectric material sheets are provided and located between the copper sheets. The dielectric sheets are ultra thin sheets of glass cloth which have been impregnated with an epoxy and partially (B-stage) cured. This B-stage curing is accomplished by heating to about 100 degrees C. for five to twenty minutes. The epoxy resin may be phenolically hardened epoxy resin. Glass cloths impregnated with this type of resin are sold by the assignee of this invention under the registered trademark Driclad.

In U.S. Pat. No. 6,616,794, entitled INTEGRAL CAPACITANCE FOR PRINTED CIRCUIT BOARD USING DIELECTRIC NANOPOWDERS and issued Sep. 9, 2003, there is described a method for producing integral capacitance components for inclusion within printed circuit boards in which hydro-thermally prepared nano-powders permit the fabrication of dielectric layers that offer increased dielectric constants and are readily penetrated by micro-vias. In the method described in this patent, a slurry or suspension of a hydro-thermally prepared nano-powder and solvent is prepared. A suitable bonding material, such as a polymer, is mixed with the nano-powder slurry, to generate a composite mixture which is formed into a dielectric layer. The dielectric layer may be placed upon a conductive layer prior to curing, or conductive layers may be applied upon a cured dielectric layer, either by lamination or metallization processes, such as vapor deposition or sputtering.

In U.S. Pat. No. 6,574,090, entitled PRINTED CIRCUIT BOARD CAPACITOR STRUCTURE AND METHOD and issued Jun. 3, 2003, there is described a capacitive element for a circuit board or chip carrier and method of manufacturing the same. The structure is formed from a pair of copper sheets having a dielectric component laminated there-between. The dielectric component, e.g., resin-impregnated fiber glass (one example being a material sold under the trade name "Driclad" by the Assignee of the present invention) is formed of two or more dielectric sheets, at least one of which can be partially cured or softened followed by being fully cured or hardened. The lamination takes place by laminating a partially cured or softened sheet to at least one other sheet of dielectric material and one of the sheets of conductive material. The total thickness of the two sheets of the dielectric component does not exceed about four mils and preferably does not exceed about three mils; thus, the single dielectric sheet does not exceed about two mils and preferably does not exceed about 1.5 mils in thickness.

In U.S. Pat. No. 6,542,379, entitled CIRCUITRY WITH INTEGRATED PASSIVE COMPONENTS AND METHOD FOR PRODUCING and issued Apr. 1, 2003, there are described passive electrical components such as capacitors, resistors, inductors, transformers, filters and resonators which are integrated into electrical circuits utilizing a process which maximizes the utilization of the planar surfaces of the substrates for high density placement of active components such as logic or memory integrated circuits. The passive components are integrated into a conventional circuit board utilizing a photoimageable dielectric material. The dielectric is photoimaged and etched to provide one or more recesses or openings for the passive devices, and photo-vias interconnecting the inputs and outputs of the integrated circuit board. The electronic structure comprising at least one of the passive devices integrated into a photoimaged dielectric is described as well as the method of manufacturing the same.

In U.S. Pat. No. 6,524,352, entitled METHOD OF MAKING A PARALLEL CAPACITOR LAMINATE and issued Feb. 25, 2003, there is defined a parallel capacitor structure capable of forming an internal part of a larger circuit board or the like structure to provide capacitance therefore. Alternatively, the capacitor may be used as an inter-connector to interconnect two different electronic components (e.g., chip carriers, circuit boards, and semiconductor chips) while still providing desired levels of capacitance for one or more of said components. The capacitor includes at least one internal conductive layer, two additional conductor layers added on opposite sides of the internal conductor, and inorganic dielectric material (preferably an oxide layer on the second conductor layer's outer surfaces or a suitable dielectric material such as barium titanate applied to the second conductor layers). Further, the capacitor includes outer conductor layers atop the inorganic dielectric material, thus forming a parallel capacitor between the internal and added conductive layers and the outer conductors.

In U.S. Pat. No. 6,496,356, entitled MULTILAYER CAPACITANCE STRUCTURE AND CIRCUIT BOARD CONTAINING THE SAME AND METHOD OF FORMING THE SAME and issued Dec. 17, 2002, there is described a method of forming a capacitive core structure and of forming a circuitized printed wiring board from the core structure. The capacitive core structure is formed by providing a central conducting plane of a sheet of conductive material and forming at least one clearance hole in the central conducting plane. First and second external conducting planes are laminated to opposite sides of the ground plane with a film of dielectric material between each of the first and second external planes and the central conducting plane. At least one clearance hole is formed in each of the first and second external planes. A circuitized wiring board structure can be formed by laminating a capacitive core structure between two circuitized structures.

In U.S. Pat. No. 6,446,317, entitled HYBRID CAPACITOR AND METHOD OF FABRICATION THEREFOR and issue Sep. 10, 2002, there is described a hybrid capacitor associated with an integrated circuit package that provides multiple levels of excess, off-chip capacitance to die loads. The hybrid capacitor includes a low inductance, parallel plate capacitor which is embedded within the package and electrically connected to a second source of off-chip capacitance. The parallel plate capacitor is disposed underneath a die, and includes a top conductive layer, a bottom conductive layer, and a thin dielectric layer that electrically isolates the top and bottom layers. The second source of off-chip capacitance is a set of self-aligned via capacitors, and/or one or more discrete capacitors, and/or an additional parallel plate capacitor. Each of the self-aligned via capacitors is embedded within the package, and has an inner conductor and an outer conductor. The inner conductor is electrically connected to either the top or bottom conductive layer, and the outer conductor is electrically connected to the other conductive layer. The discrete capacitors are electrically connected to contacts from the conductive layers to the surface of the package. During operation, one of the conductive layers of the low inductance parallel plate capacitor provides a ground plane, while the other conductive layer provides a power plane.

In U.S. Pat. No. 6,395,996, entitled MULTI-LAYERED SUBSTRATE WITH A BUILT-IN CAPACITOR DESIGN and issued May 28, 2002, there is described a multi-layered substrate having built-in capacitors which are used to decouple high frequency noise generated by voltage fluctuations between a power plane and a ground plane of a multi-layered substrate. At least one kind of dielectric material, which has filled-in through holes between the power plane and the ground plane and includes a high dielectric constant, is used to form the built-in capacitors.

In U.S. Pat. No. 6,370,012, entitled CAPACITOR LAMINATE FOR USE IN PRINTED CIRCUIT BOARD AND AS AN INTERCONNECTOR and issued Apr. 9, 2002, there is described a parallel capacitor structure capable of forming an internal part of a larger circuit board or the like structure to provide capacitance there-for. Alternatively, the capacitor may be used as an inter-connector to interconnect two different electronic components (e.g., chip carriers, circuit boards, and even semiconductor chips) while still providing desired levels of capacitance for one or more of said components. The capacitor includes at least one internal conductive layer, two additional conductor layers added on opposite sides of the internal conductor, and inorganic dielectric material (preferably an oxide layer on the second conductor layer's outer surfaces or a suitable dielectric material such as barium titanate applied to the second conductor layers). Further, the capacitor includes outer conductor layers atop the inorganic dielectric material, thus forming a parallel capacitor between the internal and added conductive layers and the outer conductors.

In U.S. Pat. No. 6,343,001, entitled MULTILAYER CAPACITANCE STRUCTURE AND CIRCUIT BOARD CONTAINING THE SAME and issued Jan. 29, 2002, there is described a method of forming a capacitive core structure and of forming a circuitized printed wiring board from the core structure. The capacitive core structure is formed by providing a central conducting plane of a sheet of conductive material and forming at least one clearance hole in the central conducting plane. First and second external conducting planes are laminated to opposite sides of the ground plane with a film of dielectric material between each of the first and second external planes and the central conducting plane. At least one clearance hole is formed in each of the first and second external planes. A circuitized wiring board structure can be formed by laminating a capacitive core structure between two circuitized structures.

In U.S. Pat. No. 6,274,224, entitled PASSIVE ELECTRICAL ARTICLE, CIRCUIT ARTICLES THEREOF, AND CIRCUIT ARTICLES COMPRISING A PASSIVE ELECTRICAL ARTICLE and issued Aug. 14, 2001, there is described a passive electrical article comprising (a) a first self-supporting substrate having two opposing major surfaces, (b) a second self-supporting substrate having two opposing major surfaces, and (c) an electrically insulating or electrically conducting layer, wherein a major surface of the first substrate in contact with the layer and a major surface of the second substrate in contact with the layer have an average surface roughness ranging from about 10 to about 300 nm and wherein a force required to separate the first and second substrates of the passive electrical article at a ninety degree peel angle is greater than about three pounds/inch (about 0.5 kN/m). Dielectric materials possessing higher dielectric constants are used, as may be alternative perovskite class materials such as barium titanate ($BaTiO_3$), lead-zirconium titanate (PZT), lead-manganese-niobium (PMN), lead titanate ($PbTiO_3$) and strontium titanate ($SrTiO_3$). Copper is used for the conductive layering.

In U.S. Pat. No. 6,256,850, entitled METHOD FOR PRODUCING A CIRCUIT BOARD WITH EMBEDDED DECOUPLING CAPACITANCE and issued Jul. 10, 2001, there is described a method for producing a capacitor to be embedded in an electronic circuit package comprising the steps of selecting a first conductor foil, selecting a dielectric material, coating the dielectric material on at least one side of the first conductor foil, and layering the coated foil with a second conductor foil on top of the coating of dielectric material. The conductor foil is copper, with other suitable conductor foils including copper-Invar-copper, Invar, aluminum, and copper pre-laminated to a dielectric. The dielectric coating may be any type of dielectric material from standard liquid epoxy, polyimide, Teflon, cyanate resins, powdered resin materials, or filled resin systems exhibiting enhanced dielectric constants. Coating of the dielectric material onto the conductor foil is performed with any number of methods known in the industry such as roller, draw, powder or curtain coating, electrostatic or electrophoretic deposition, screen printing, spraying, dipping or transfer of a dry film.

In U.S. Pat. No. 6,215,649, entitled PRINTED CIRCUIT BOARD CAPACITOR STRUCTURE AND METHOD and issued Apr. 10, 2001, there is described a capacitive element for a circuit board or chip carrier. The structure is formed from a pair of conductive sheets having a dielectric component laminated there-between. The dielectric component is formed of two or more dielectric sheets at least one of which can be partially cured or softened followed by being fully cured or hardened. The lamination takes place by laminating a partially cured or softened sheet to at least one other sheet of dielectric material and one of the sheets of conductive material. The use of two or more sheets of dielectric material is alleged in this patent to make it unlikely that two or more defects in the sheets of dielectric material will align, thus greatly reducing the probability of a defect causing a failure in test or field use.

In U.S. Pat. No. 6,207,595, entitled LAMINATE AND METHOD OF MANUFACTURE THEREOF and issued Mar. 27, 2001, there is described a fabric-resin dielectric material for use in a laminate structure and method of its manufacture. The resulting structure is adaptable for use in a printed circuit board or chip carrier substrate. The resin may be an epoxy resin such as is currently used on a large scale worldwide for "FR-4" composites. A resin material based on bismaleimide-triazine (BT) is also acceptable, this patent further adding that, more preferably, the resin is a phenolically hardenable resin material as is known in the art, with a glass transition temperature of about 145 degrees C.

In U.S. Pat. No. 6,150,456, entitled HIGH DIELECTRIC CONSTANT FLEXIBLE POLYIMIDE FILM AND PROCESS OF PREPARATION and issued Nov. 21, 2000, there is described a flexible, high dielectric constant polyimide film composed of either a single layer of an adhesive thermoplastic polyimide film or a multilayer polyimide film having adhesive thermoplastic polyimide film layers bonded to one or both sides of the film and having dispersed in at least one of the polyimide layers from 4 to 85 weight % of a ferroelectric ceramic filler, such as barium titanate or polyimide-coated barium titanate, and having a dielectric constant of from 4 to 60. The high dielectric constant polyimide film can be used in electronic circuitry and electronic components such as multilayer printed circuits, flexible circuits, semiconductor packaging and buried (internal) film capacitors.

In U.S. Pat. No. 6,068,782, entitled INDIVIDUAL EMBEDDED CAPACITORS FOR LAMINATED PRINTED CIRCUIT BOARDS and issued May 30, 2000, there is described a method of fabricating individual, embedded capacitors in multilayer printed circuit boards. The method is allegedly compatible of being performed using standard printed circuit board fabrication techniques. The capacitor fabrication is based on a sequential build-up technology employing a first pattern-able insulator. After patterning of the insulator, pattern grooves are filled with a high dielectric constant material, typically a polymer/ceramic composite. Capacitance values are defined by the pattern size, thickness and dielectric constant of the composite. Capacitor electrodes and other electrical circuitry can be created either by etching laminated copper, by metal evaporation or by depositing conductive ink.

In U.S. Pat. No. 5,972,053, entitled CAPACITOR FORMED WITHIN PRINTED CIRCUIT BOARD and issued Oct. 26, 1999, there is described a process for manufacturing a multi-layer printed circuit board utilizing layers including Ta and Hf and various other elements including Ta and Hf as part thereof for the board's layers. A capacitor may also be formed using this approach, according to the authors of this patent.

In U.S. Pat. No. 5,796,587, entitled PRINTED CIRCUIT BOARD WITH EMBEDDED DECOUPLING CAPACITANCE AND METHOD FOR PRODUCING SAME and issued Aug. 18, 1998, there is described a method for producing a capacitor to be embedded in an electronic circuit package comprising the steps of selecting a first conductor foil, selecting a dielectric material, coating the dielectric material on at least one side of the first conductor foil, and layering the coated foil with a second conductor foil on top of the coating of dielectric material.

In U.S. Pat. No. 5,162,977, entitled PRINTED CIRCUIT BOARD HAVING AN INTEGRATED DECOUPLING CAPACITIVE ELEMENT and issued Nov. 10, 1992, there is described a PCB which includes a high capacitance power distribution core, the manufacture of which is compatible with standard printed circuit board assembly technology. The high capacitance core consists of a ground plane and a power plane separated by a planar element having a high dielectric constant. The high dielectric constant material is typically glass fiber impregnated with a bonding material, such as epoxy resin loaded with a ferro-electric ceramic substance having a high dielectric constant. The ferro-electric ceramic substance is typically a nano-powder combined with an epoxy bonding material. According to this patent, the resulting capacitance of the power distribution core is sufficient to totally eliminate the need for decoupling capacitors on a PCB.

In U.S. Pat. No. 5,079,069, there is described a capacitor laminate which allegedly serves to provide a bypass capacitive function for devices mounted on the PCB, the capacitor laminate being formed of conventional conductive and dielectric layers whereby each individual external device is allegedly provided with capacitance by a proportional portion of the capacitor laminate and by borrowed capacitance from other portions of the capacitor laminate, the capacitive function of the capacitor laminate being dependent upon random firing or operation of the devices. That is, the resulting PCB still requires the utilization of external devices thereon, and thus does not afford the PCB external surface area real estate savings mentioned above which are desired and demanded in today's technology.

In U.S. Pat. No. 5,027,253, entitled CAPACITOR LAMINATE FOR USE IN CAPACITIVE PRINTED CIRCUIT BOARDS AND METHODS OF MANUFACTURE and issued Jan. 7, 1992, there is described a multilayer circuit package having a "buried" thin film capacitor. The circuit package includes at least a power core, a ground core, a first signal core, a second signal core, and the integral, buried, thin film capacitor. The integral, buried, thin film capacitor serves to capacitively couple the first and second signal cores. Structurally, the first signal core includes at least one first wire that terminates in at least one first electrode, while the second signal core includes at least one second wire that terminates in at least one second electrode. At least a portion of the first electrode overlays at least a portion of the first electrode overlays at least a portion of the second electrode and is separated there-from by a thin film of a dielectric material. The first electrode, the second electrode, and the thin film of dielectric material define the integral buried capacitor. The thin film capacitor is prepared by thin film methodology, with epitaxial deposition of the dielectric In U.S. Pat. No. 4,945,399, entitled ELECTRONIC PACKAGE WITH INTEGRATED DISTRIBUTED DECOUPLING CAPACITORS and issued Jul. 31, 1990, there is described a semiconductor chip carrier which includes a plurality of distributed high frequency decoupling capacitors as an integral part of the carrier. The distributed capacitors are formed as a part of the first and second layers of metallurgy and separated by a layer of thin film dielectric material built up on a substrate. The distributed capacitors are positioned to extend from a ground pin of one of the layers of metallurgy to a plurality of mounting pads which are integral parts of the other of the layers of metallurgy. A semiconductor chip is mounted to the mounting pads and receives electrical power and signals there-through. The distributed capacitors decrease electrical noise associated with simultaneous switching of relatively large numbers of off-chip drivers which are electrically connected to the semiconductor chip.

Today's circuitized substrate manufacturers, responding to increasing demands for miniaturization, must provide decreasing signal line widths and thru-hole diameters in order to provide even greater circuit densities. Unfortunately, in doing so, they also confront many manufacturing problems. For example, some current processes utilize inner-layer materials that are typically glass-reinforced resin or other suitable dielectric material layers having a thickness of from about two to five mils, clad with metal (typically copper) on both surfaces. Glass-reinforcing material, typically utilizing continuous strands of fiberglass which extend throughout the width and length of the overall final substrates, is used to contribute strength and rigidity to the final stack. Being continuous, these strands commonly run the full width (or length) of the structure and include no breaks or other segments as part thereof. Such fibrous materials occupy a relatively significant portion of the substrate's total volume, a disadvantage especially when attempting to produce highly dense numbers of thru-holes and very fine line circuitry to meet new, more stringent design requirements.

More specifically, when holes are drilled (typically using laser or mechanical drills) to form these needed thru-holes, end segments of the fiberglass fibers may extend into the holes during lamination, and, if so, must be removed prior to metallization. This removal, in turn, creates the need for additional pretreatment steps such as the use of glass etchants to remove the glass fibrils extending into the holes, subsequent rinsing, etc. If the glass is not removed, a loss of continuity might occur in the internal wall metal deposit. In addition, both continuous and semi-continuous glass fibers add weight and thickness to the overall final structure, yet another disadvantage associated with such fibers. Additionally, since lamination is typically at a temperature above 150 degrees C., the resinous portion of the laminate may then shrink during cooling to the extent permitted by the rigid copper cladding, which is not the case for the continuous strands of fiberglass or other continuous reinforcing material used.

The strands thus take on a larger portion of the substrate's volume following such shrinkage and add further to complexity of manufacture in a high-density product. If the copper is etched to form a discontinuous pattern, laminate shrinkage may not be restrained even to the extent above by the copper cladding. Obviously, this problem is exacerbated as feature sizes (line widths and thicknesses, and thru-hole diameters) decrease. Consequently, even further shrinkage may occur. The shrinkage, possibly in part due to the presence of the relatively large volume percentage of continuous or semi-continuous fiber strands in the individual layers used to form a final product possessing many such layers, may have an adverse affect on dimensional stability and registration between said layers, adding even more problems for the PCB manufacturer.

The presence of glass fibers, especially those of the woven type, also substantially impairs the ability to form high quality, very small thru-holes, including when using a laser. Glass cloth has drastically different absorption and heat of ablation properties than typical thermoset or thermoplastic matrix resins. In a typical woven glass cloth, for example, the density of glass a laser might encounter can vary from approximately 0% in a window area to approximately 50% by volume or even more, especially in an area over a cloth "knuckle". This wide variation in encountered glass density leads to problems obtaining the proper laser power for each thru-hole and may result in wide variations in thru-hole quality, obviously unacceptable by today's very demanding manufacturing standards.

Glass fiber presence also often contributes to an electrical failure mode known as CAF growth. CAF (cathodic/anodic filament) growth often results in an electrical shorting failure which occurs when dendritic metal filaments grow along an interface (typically a glass fiber/epoxy resin interface), creating an electrical path between two features which should remain electrically isolated. Whether continuous (like woven cloth) or semi-continuous (like chopped fiber mattes), glass fiber lengths are substantial in comparison to the common distances between isolated internal features, and thus glass fibers can be a significant detractor for PCB insulation resistance reliability. While the use of glass mattes composed of random discontinuous chopped fibers (in comparison to the longer fibers found in continuous structures) can largely abate the problem of inadequate laser drilled thru-hole quality, such mattes still contain fibers with substantial length compared to internal board feature spacing and, in some cases, offer virtually no relief from the problem of this highly undesirable type of growth.

The utilization of ground and pre-fired ceramic powders in the dielectric layer, including as substitutes for the above glass fibers, also generally poses obstacles for the formation of thru-holes between conductive layers of a PCB. Pre-fired and ground ceramic nano-powder particles have a typical dimension in the range of 500-20,000 nanometers (nm). Furthermore, the particle distribution in this range is generally rather broad, meaning that there could be a 10,000 nm particle alongside a 500 nm particle.

The distribution within the dielectric layer of particles of different size often presents obstacles to thru-hole formation where the thru-holes are of extremely small diameter, also referred to in the industry as micro-vias. Another problem associated with pre-fired ceramic nano-powders is the ability for the dielectric layer to withstand substantial voltage without breakdown occurring across the layer. Typically, capacitance layers within a PCB are expected to withstand at least 300 volts (V) in order to qualify as a reliable component for PCB construction. The presence of the comparatively larger ceramic particles in pre-fired ceramic nano-powders within a capacitance layer prevents extremely thin layers from being used because the boundaries of contiguous large particles provide a path for voltage breakdown. This is even further undesirable because, as indicated by the equation cited above, greater planar capacitance may also be achieved by reducing the thickness of the dielectric layer. The thickness is thus limited by the size of the particles therein.

Some commercially available dielectric powders which have been used in internal conductive structures such as mentioned in some of the above patents, among these being metal titanate-based powders (see, e.g., U.S. Pat. No. 6,150,456), are known to be produced using a high-temperature, solid-state reaction of a mixture of the appropriate stoichiometric amounts of oxides or oxide precursors (e.g., carbonates, hydroxides or nitrates) of barium, calcium, titanium, and the like. In such calcination processes, the reactants are wet-milled to accomplish a desired final mixture. The resulting slurry is dried and fired at elevated temperatures, sometimes as high as 1,300 degrees C., to attain the desired solid state reactions.

Thereafter, the fired product is milled to produce a powder. Although the pre-fired and ground dielectric formulations produced by solid phase reactions are acceptable for many electrical applications, these suffer from several disadvantages. First, the milling step serves as a source of contaminants, which can adversely affect electrical properties. Second, the milled product consists of irregularly shaped fractured aggregates which are often too large in size and possess a wide particle size distribution, 500-20,000 nm. As a result, films produced using these powders are limited to thicknesses greater than the size of the largest particle. Thirdly, powder suspensions or composites produced using pre-fired ground ceramic powders typically must be used immediately after dispersion, due to the high sedimentation rates associated with large particles.

The stable crystalline phase of barium titanate for particles greater than 200 nm is tetragonal and, at elevated temperatures, a large increase in dielectric constant occurs due to a phase transition. It is thus clear that methods of making PCBs which rely on the advantageous features of using nano-powders as part of the PCB's internal components or the like, such as those described in selected ones of the above patents, possess various undesirable aspects which are detrimental to providing a PCB with optimal functioning capabilities when it comes to internal capacitance or other electrical operation. This is particularly true when the desired final product attempts to meet today's miniaturization demands, including the utilization of high density patterns of thru-holes therein.

In view of the above, it is believed that a method of making a circuitized substrate having therein a capacitor which obviates many of the problems described above would constitute a significant advancement in the art.

SUMMARY OF THE INVENTION

It is, therefore, a primary object of the present invention to enhance the circuitized substrate art by providing a new and unique method of making a circuitized substrate including a capacitor therein.

It is another object of the invention to provide such a method of making such a substrate which can be accomplished in a relatively facile manner and at relatively low costs.

According to one aspect of the invention, there is provided a method of making a substrate including an internal capacitor, the method comprising providing a first dielectric layer, providing a capacitive dielectric layer on the first dielectric layer, forming at least two spaced-apart channels within the capacitive dielectric layer, depositing electrically conductive material within the spaced-apart channels, and providing a second dielectric layer over the electrically conductive material within the spaced-apart channels to form a substrate, the electrically conductive material within the spaced-apart channels forming a capacitor within the substrate.

According to another aspect of the invention, there is provided a method of making a circuitized substrate including at least one internal capacitor, this method comprising providing a first dielectric layer, forming a layer of electrically conductive material on the first dielectric layer, depositing capacitive dielectric material within the spaced-apart channels, and providing a second dielectric layer over the layer of electrically conductive material and the capacitive dielectric material within the spaced-apart channels to form a circuitized substrate, the electrically conductive material defining the spaced-apart channels and the capacitive dielectric material within the channels forming a capacitor within said circuitized substrate.

BRIEF DESCRIPTION OF THE DRAWINGS

Various objects, features, and attendant advantages of the present invention will become more fully appreciated as the same becomes better understood when considered in conjunction with the accompanying drawings, in which like reference characters designate the same or similar parts throughout the several views, and wherein.

DETAILED DESCRIPTION OF THE PREFERRED EMBODIMENT

Figure 1:
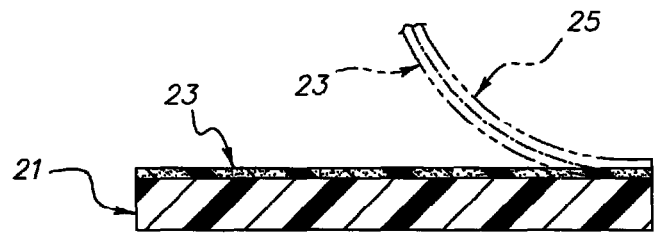
FIG. 1 is a side elevational view, in section and on an enlarged scale, illustrating the initial steps of forming a plurality of capacitors on a dielectric layer, according to one embodiment of the invention.

For a better understanding of the present invention, together with other and further objects, advantages and capabilities thereof, reference is made to the following disclosure and appended claims in connection with the above-described drawings. Like figure numbers may be used from FIGURE to FIGURE to identify like elements in these drawings.

By the term "circuitized substrate" as used herein is meant a substrate including at least one first dielectric layer, an internal capacitor and at least one second dielectric layer over the capacitor. Such substrates may be adapted for having one or more electrical components electrically coupled thereto, e.g., to form an electrical assembly. The substrates as formed in accordance with the teachings herein may be combined with other substrates and/or dielectric and conductive layers to form a thicker, multilayered circuitized substrate such as a PCB or chip carrier. The dielectric materials for such dielectric layers may comprise conventional dielectric materials such as fiberglass-reinforced epoxy resins (some referred to as "FR-4" dielectric materials in the art), polytetrafluoroethylene (Teflon), polyimides, polyamides, cyanate resins, photo-imageable materials, and other like materials. Examples of conductive materials for use as such additional conductive layers, if utilized, include copper and copper alloy, but other metals may be used.

By the term "capacitor" as used herein is meant a layer structure including at least two spaced-apart channels having, in one form (where the layer is of capacitive material and includes the channels), a quantity of electrically conductive material therein, and, in another form (where the layer is of conductive material having the channels therein), a quantity of capacitive dielectric material therein. This layer structure, when joined to a suitable electrical power source, will provide capacitance across the spacing between the conductive materials.

By the term "continuous" as used herein to define fibrous materials is meant a structure such as a woven cloth including lengthy fibers, including fibers which run the full distance through the structure. By the term "semi-continuous" as used herein to define fibrous materials is meant structures with much shortened length fibers, which are also referred to as "chopped" fibers, one example being chopped fiber mats.

By the term "electrical component" as used herein is meant components such as semiconductor chips and the like which are adapted for being positioned on the external conductive surfaces of substrates and electrically coupled to the substrate for passing signals from the component into the substrate whereupon such signals may be passed on to other components, including those mounted also on the substrate, as well as other components such as those of a larger electrical system in which the substrate is positioned.

By the term "electrical assembly" is meant at least one circuitized substrate as defined herein in combination with at least one electrical component electrically coupled thereto and forming part of the assembly. Examples of known such assemblies include chip carriers which include a semiconductor chip as the electrical component, the chip usually positioned on the substrate and coupled to wiring (e.g., pads) on the substrate's outer surface or to internal conductors using one or more thru-holes. Perhaps the most well known such assembly is the conventional printed circuit board (PCB) typically having several external components such as chip carriers, semiconductor chips, etc. mounted thereon and coupled to the internal circuitry of the PCB.

By the term "electroplating" as used herein is meant a process by which a metal in its ionic form is supplied with electrons to form a non-ionic coating on a desired substrate. The most common system involves: a chemical solution which contains the ionic form of the metal, an anode (positively charged) which may consist of the metal being plated (a soluble anode) or an insoluble anode (usually carbon, platinum, titanium, lead, or steel), and finally, a cathode (negatively charged) where electrons are supplied to produce a film of non-ionic metal.

By the term "electroless plating" (also known as chemical or auto-catalytic plating) as used herein is meant a non-galvanic type of plating method that involves several simultaneous reactions in an aqueous solution, which occur without the use of external electrical power. The reaction is accomplished when hydrogen is released by a reducing agent, normally sodium hypophosphite, and oxidized thus producing a negative charge on the surface of the part.

By the term "ferroelectric ceramic" as used herein is meant ceramics that possess ferroelectric properties. These include barium titanate, substituted barium titanate, strontium titanate, lead titanate, lead zirconate titanate, substituted lead zirconate titanate, lead magnesium niobate, lead zinc niobate, lead iron niobate, solid solutions of lead magnesium niobate and lead titanate, solid solutions of lead zinc niobate and lead titanate, lead iron tantalite, other ferroelectric tantalates, and combinations or mixtures thereof.

By the term "high molecular mass" as used herein to define the flexibilizers used in the capacitor material compositions herein is meant a molecular mass of at least 4,000 grams/mole.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc. Such systems typically include one or more PCBs, chip carriers, etc. as integral parts thereof. For example, a PCB typically used includes a plurality of various components such as chip carriers, capacitors, resistors, modules, etc. mounted thereon. One such PCB may be referred to as a "motherboard" while various other boards (or cards) may be mounted thereon using suitable electrical connectors.

By the term "laser ablation" as used herein is meant the process of removing material from a solid surface by irradiating it with a laser beam. At low laser flux, the material is heated by the absorbed laser energy and evaporates or sublimes. At high laser flux, the material is typically converted to a plasma. The term laser ablation as used herein refers to removing material with a pulsed laser as well as ablating material with a continuous wave laser beam if the laser intensity is high enough.

By the term "nano-particles" is meant particles with a size of from about 0.01 micron (ten nanometers) to about one micron (1000 nanometers). The capacitor material powders used to form the capacitor members herein are understood to include "nano-particles."

By the term "photoimgaeable polymer" as used herein is meant a material including three major components: a photo-active compound that undergoes cross-linking polymerization reaction on exposure to suitable radiation; a photo-packaging compound that initiates the radical polymerization; and a solvent or binder that carries both the photo-active and photo-packaging compounds either in liquid or solid form. One example is epoxy acrylate resin with a pendant —COON group and 2,2'-dimethoxy-2-phenylacetophenon.

By the term "sputtering" as used herein is meant the deposition process in which a target material is bombarded with a charged gas (a typical example being argon) which releases atoms in the target that coats the nearby substrate. The process occurs within a magnetron vacuum chamber under low pressure.

By the term "thru-hole" as used herein is meant to include what are also commonly referred to in the industry as "blind vias" which are openings typically from one surface of a substrate to a predetermined distance therein, "internal vias" which are vias or openings located internally of the substrate and are typically formed within one or more internal layers prior to lamination thereof to other layers to form the ultimate structure, and "plated through holes" (also known as PTHS), which typically extend through the entire thickness of a substrate. All of these various openings form electrical paths through the substrate and often include one or more conductive layers, e.g., plated copper, thereon. Alternatively, such openings may simply include a quantity of conductive paste or, still further, the paste can be additional to plated metal on the opening sidewalls. These openings in the substrate are formed typically using mechanical drilling or laser ablation, following which the plating and/or conductive paste are be added.

In FIG. 1, a first dielectric layer 21 of one of the dielectric materials cited above is provided. In one example, the material for layer 21 is the cited "FR-4" material, and the layer is from about two mils (a mil being $\frac{1}{1000}$ of an inch) to about eight mils thick. The length and width dimensions may be similar to those of conventional such layers as utilized in PCB and chip carrier production. A quantity of capacitive dielectric material 23 is deposited on layer 21. A preferred method of applying material 23 is in liquid form, using, for example, a curtain, roller or draw-down coating process. Examples of the compositions of such capacitive materials are defined below. Such application may also be accomplished in a roll-to-roll format in which a singular elongated layer of dielectric material is drawn from a roller source and the capacitive material deposited thereon as the dielectric is pulled onto another receiving roller. Further processing, as defined herein, occurs before final roll-up may occur, in order to form individual layered structures.

Alternatively, it is also possible to deposit material 23 in paste form using a screen printing operation or in ink form using a ink-jet printing operation. Still further, it is possible to deposit the capacitive material on a carrier (25, in phantom) such as a copper sheet and then bond (e.g., using conventional PCB lamination processing) the combined carrier-capacitive material structure to layer 21. This alternative approach is represented by the structure in phantom in FIG. 1. The carrier, if a copper or other metal foil member, may then be removed in a blanket manner such as by a stripping or other separation procedure, leaving only the capacitive layer remaining.

Material 23 is preferably of similar composition as the non-flaking capacitive materials defined in U.S. patent application Ser. No. 11/730,761, but is not limited to same. As mentioned below, this material may be a photoimageable type material, and processed using procedures known in the photoimageable PCB art. If of a material as defined in U.S. patent application Ser. No. 11/730,761, material 23 is comprised of a thermosetting resin, a high molecular mass flexibilizer, and a quantity of nano-particles of a ferroelectric ceramic material. Significantly, the material forming the layer as shown is not applied onto a supporting web or the like material such as fiberglass mesh, and thus does not include continuous or semi-continuous fibers as part thereof. Equally significant, the coated material 23 may have a thickness of from about two to three microns, an extremely valuable characteristic when considering the microminiaturization demanded in many of today's electrical products such as substrates of the type defined herein. In one example, material 23 was coated to a thickness of only 2.5 microns, but may be applied at a thickness of from about one micron to about 2500 microns. (A micron is understood to be a metric length dimension equal to one millionth of a meter.)

A preferred thermosetting resin used for material 23 is an epoxy resin, and more preferably an epoxy novalac resin such as one sold under product designation "LZ 8213", by Huntsman, Salt Lake City, Utah. Other acceptable thermosetting resins usable herein include high temperature diglycidyl ether, polyimide, cyanate ester (triazines), bismaleimide, bismaleimide and epoxy modified blend, benzoxazine, epoxy modified benzoxazine, halogen free benzoxazine, fluoropolymer, benzocyclobutene, perfluorobutane, polyphenylenesulfide, polysulfone, polyetherimide, polyetherketone, polyphenylquinoxaline, polybenzoxazole, polyphenyl benzobisthiazole and combinations thereof. In general the epoxy resin may be selected from the group including the diglycidyl ethers of resorcinol, catechol, hydroquinone, biphenol, bisphenol A, tetrabromobisphenol A, phenolaldehyde novolac resins, alkyl substituted phenolaldehyde resins, bisphenol F, tetramethylbiphenol, tetramethyltetrabromophenol, tetrachlorobisphenol A, and combination thereof. The cyanate esters, if used, may be selected from the group consisting of cyanatobenzene, dicyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 4,4'-dicyanatobiphenyl, bis(4-cyanatophenyl)methane, 2,2-bis(4-cyanatophenyl)propane, 2,2-bis(3,5-dichloro 4-cyanatophenyl)propane, 2,2-bis(3,5-diblomo 4-dicyanatophenyl)propane, bis(4-cyanatophenyl)ether, bis(4-cyanatophenyl)thioether, bis(4-cyanatophenyl)sulfone, tris(4-cyanatophenyl)-phosphite, tris(4-cyanatophenyl)phosphate, bis(3-chloro-4-cyanatophenyl)methane, cyanated novolak derived from novolak cyanated disphenol type polycarbonate oligomer derived from bisphenol type polycarbonate oligomers, and combinations thereof.

A preferred high molecular mass flexibilizer used in this composition is phenoxy resin, and, in particular, one sold under the product name "PKHS-40" by the InChem Corporation, having a business location at Rock Hill, S.C. Other high molecular mass flexibilizers include oligomeric resin and polymeric resin. When used, the phenoxy resin comprises from about five to twenty percent by weight of the capacitor material 21.

A preferred ferroelectric ceramic material used herein is barium titanate ($BaTiO_3$) powder available from Cabot Corporation under the product designation "BT-8", Cabot Corporation having a business location in Boyertown, Pa. An alternative $BaTiO_3$ powder is also available from the Nippon Chemical Industrial Co., Ltd., of Tokyo, Japan. Other such ceramics include substituted barium titanate, strontium titanate, lead titanate, lead zirconate titanate, substituted lead zirconate titanate, lead magnesium niobate, lead zinc niobate, lead iron niobate, solid solutions of lead magnesium niobate and lead titanate, solid solutions of lead zinc niobate and lead titanate, lead iron tantalite, other ferroelectric tantalates, and combinations or mixtures thereof. Of importance, it has been determined that material 23 should include less than about eighty percent (by weight) of barium titanate in the material's final form (following heating), with more detailed examples below. Such a percentage is deemed important to assure non-flaking of the material following heating to remove the solvent carrier and partially advance the thermosetting resin thereof as defined below. The particles of the ferroelectric ceramic are nano-particles, having the dimensions cited above. It is also possible to use micro and/or nano-micro ferroelectric ceramic particles.

Following deposition, the capacitive dielectric material 23 (and layer 21) are heated to a temperature within the range of from about 120 degrees C. to about 140 degrees C. for a time period of from about two minutes to about four minutes. In one example, with a 2.5 micron material 23 thickness, the material and layer were heated to 130 degrees C. for approximately three minutes. This is preferably accomplished by placing the FIG. 1 structure within a suitable convection oven. Such heating, in addition to driving off residual organic solvents from the composition, also serves to at least partly cure the capacitor material. Most significantly, heating this structure has proven to substantially eliminate the possibility of the capacitor material from flaking.

Figure 2:
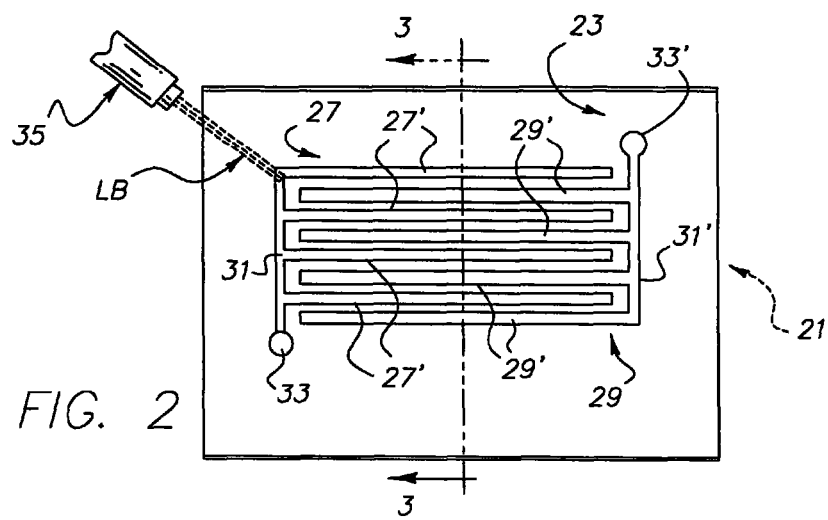
FIG. 2 is a top plan view of the capacitive dielectric layer according to one embodiment of the invention and the formation of spaced apart channels therein, FIG. 2 being taken from over FIG. 1.

The next step in producing the substrate of the invention, as depicted in FIG. 2, involves the forming of at least two spaced-apart channels 27 and 29 within the formed layer of capacitive dielectric material 23. This layer is shown in plan view in FIG. 2, looking down from the side view of FIG. 1. In general, the channel depths are the same or even less than the capacitive dielectric layer thickness, but it also possible that the channel depths may penetrate dielectric layer 21. Dielectric layer 21 (numeral shown by hidden line) is understood to lie beneath the capacitive dielectric material 23 in FIG. 2. In the FIG. 2 embodiment, each channel is of comb-like shape, having four projecting portions 27' and 29', respectively, with the projecting portions being oriented in an alternating pattern as shown. A common portion 31 and 31', respectively, joins the projecting portions. On this example, each channel further includes a pad portion (33 and 33', respectively). It is also possible that common portion 31 and 31' be a line instead of a channel, and connected with a pad portion (33 and 33').

The preferred means of forming channels 27 and 29, if the capacitive dielectric material is of one of the compositions defined above, is to use laser ablation in which a Nd:YAG laser (represented by the numeral 35) directs laser beams (LB) onto the capacitive dielectric material. In one example, the laser micromachining was performed using an Electro Scientific Industries, Inc. (of Portland, Oreg.) 5210 Laser Microvia Drill System. The Nd:YAG laser, a frequency-tripled model, operated at a wavelength of 355 nm with a pulse width on the order of fifty nanoseconds. The beam was positioned relative to the surface of the capacitive material by coordinated motion of the stage on which the substrate sample was mounted (y-axis), the optics (x-axis), and galvo mirrors (x and y axes). The position of the sample with respect to the focal plane of the laser beam (along the z-axis) may also be adjusted using this equipment. The spatial distribution of energy in the circular laser spot is homogenized by use of optics, also provided by Electro Scientific Industries, Inc.

Further, the beam diameter at the surface of the sample may be varied by adjusting the relative position of the imaged beam with respect to the material surface. The resulting width of each channel is, in one example, fifty microns, with each channel having a rectangular (e.g., square) cross-sectional configuration. Each of the projection portions 27' and 29' measured a length of approximately one centimeter. Given the materials and capabilities of this equipment, it was possible to attain a speed at which the beam traced along the programmed beam path of about 100 millimeters per second. It is understood that the invention is not limited to the Nd:YAG laser used herein. Alternate laser systems such as $CO_2$, He—Ne, excimer etc operating either in continuous wave (CW) or pulsed mode can be used for laser micromachining.

It is also understood that the invention is not limited to the comb-like channels shown herein in that many other configurations may be successfully used. The invention is also not limited to four projection portions for each channel structure, as many more are possible. In the broadest aspects of the invention, only two spaced apart channels need be provided, with a predetermined spacing there-between.

Figure 3:
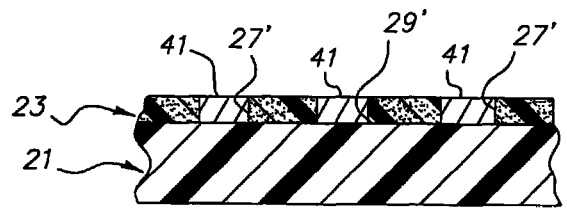
FIG. 3 is a side elevational view, in section and on a much enlarged scale over the view of FIG. 1, illustrating the deposition of electrically conductive material within some of the channels of the layer in FIG. 2.

In the partial view of FIG. 3, electrically conductive material 41 is deposited within each of the channels. FIG. 3 is taken along a section line 3-3 in FIG. 2 with only two channel portions 27' and one channel portion 29' being shown. Material 41 is also deposited within portions 31 and 31', as well as portions 33 and 33', all in a simultaneous manner. The preferred conductor material for material 41 is copper or copper alloy, and deposition may be accomplished using two deposition procedures, the first being conventional sputtering processing. During such sputtering, a thin layer of the copper metal is vacuum deposited with each channel. Such sputtering may also include depositing a barrier metal layer prior to the copper layer, such a barrier layer typically comprised of chrome or titanium with a thickness of 50 angstroms to about 500 angstroms.

The sputtered copper layer may then be used as a seed layer for a subsequent electroplating deposition procedure, in which more copper is formed in the channels. Other methods may be used for depositing the copper or copper alloy material 41, including a combined electro-less and electroplating process in which the initial copper or copper alloy is deposited using electro-less plating (defined above), following which an electroplating procedure (e.g., similar to that above used following the sputtering procedure) is used. Significantly, if the capacitive dielectric material is of the photoimageable type as mentioned below, similar procedures for deposition may be employed. As shown, each channel is filled with the conductor. Conventional sputtering, electro-less and electroplating processes known in the PCB art may be utilized to accomplish the above deposition.

Following conductive material deposition, it is preferred to remove any possible excess copper or copper alloy material which may have been formed on the upper surface of layer 23. In one embodiment, removal of this excess material is accomplished using a chemical polishing procedure known in the art. If excessive (residual) metal is formed atop the conductor-filled channels, removal of same might also be desirable and, again, a chemical polishing process may be used.

Figure 3A:
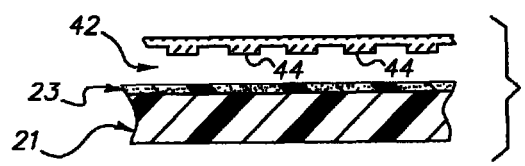
FIGS. 3a, 3b and 3c are side elevational views, in section, of the steps used to imprint channels within capacitive dielectric material according to an alternate embodiment of the invention.
Figure 3B:
Figure 3C:

FIGS. 3a through 3c represent an alternative approach to forming a capacitor structure of the invention, which may be referred to as an imprinting procedure. In this procedure, a silicon dioxide mold 42 including a plurality of projecting elements 44 is aligned above a dielectric layer 21-capacitive dielectric material 23 subassembly similar to that formed in FIG. 1. The projecting elements may understandably be of a similar, albeit reverse image configuration as the spaced-apart channels in FIG. 2. Mold 42 is brought into contact with material 23 preferably using a lamination process similar to that used in PCB lamination of dielectric and conductive layers. In this particular embodiment, the lamination may be achieved at a temperature within the range of from about 180 degrees C. to about 195 degrees C. and a pressure of from about 450 PSI to about 550 PSI, for a time period of from about 100 to about 140 minutes. In a specific example, a pressure of 500 PSI, temperature of 188 degrees C. and a time period of two hours may be used. The capacitive material, so heated, accommodates the projecting elements 44 therein, to thus define the desired pattern of channels therein. After being cooled down, mold 42 is separated (released) from the now formed capacitive material, leaving a structure such as shown in FIG. 3c. Example Five below represents a more detailed example of such a process.

Figure 4:
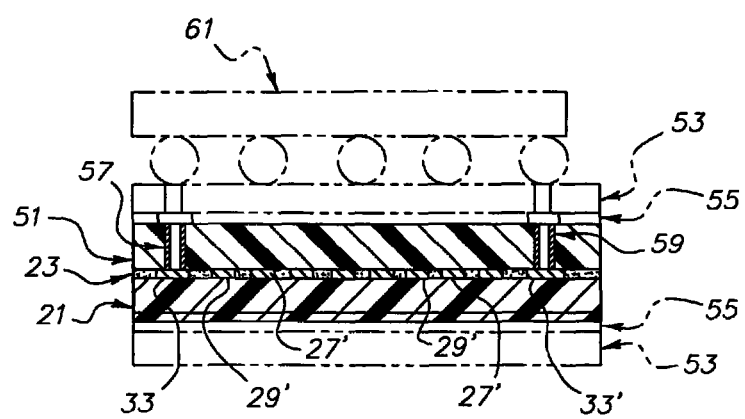
FIG. 4 is a side elevational view, in section and on an enlarged scale, illustrating the addition of another dielectric layer to the structure of FIG. 3, and the possible addition of further conductive and dielectric layers, to form a substrate adapted for having an electronic component positioned thereon and/or electrically connected thereto.

In FIG. 4, a second dielectric layer 51 is positioned over the electrically conductive material 41 and remaining capacitive dielectric material of layer 23. Layer 51, as does underlying layer 21, serves as electrical insulation between the conductors in each channel and any other conductors which may be formed and used in the substrate. In one embodiment, layer 51 is formed directly atop layer 23 using a conventional PCB lamination process. The lamination procedure, if used at a sufficiently high temperature and pressure, may serve to further cure the capacitive dielectric material from a partly cured state existing following the oven heating described above, if such a partial cure exists at this time. Layer 51 is preferably similar to layer 21 in dimensions and material.

The three-layered structure shown in solid in FIG. 4, in its simplest form as shown, is now capable of serving as a capacitor "core" within a larger capacitive substrate such as a multilayered PCB. If the case, additional dielectric and conductive layers 53 and 55 (shown in phantom), respectively, may be added, including to the bottom layer 21 and/or over the upper layer 51. Only two of each of these added layers are shown for illustration purposes in FIG. 4. If such additional conductive layers are added, it would be typically desirable to further process these layers; that is, to "personalize" each. Such "personalizing" is known in the PCB art and typically includes use of photolithographic processing in which a photo-resist is applied to the metal conductors, exposed and developed, following which etching of selected (unprotected) portions of the conductor layers occurs. The result is a pattern of individual conductors (not shown in FIG. 4), including possibly lines and/or pads. Selected ones of said lines and/or pads may then be coupled to the portions 33 and 33' to thereby form a capacitor as part of the circuit pattern including such pads and/or lines. Such connections may be achieved using thru-holes 57 and 59. These thru-holes may also extend through additional layers of the structure, including to the surface thereof so as to couple to an electronic component 61 positioned atop the structure. In one example, component 61 may be a semiconductor chip or even a chip carrier, and be electrically coupled to selected ones of external conductors (not shown) formed on the upper surface of the FIG. 4 structure, e.g., using solder balls 63. Such external conductors and solder connections are known in the art and further description is not considered necessary. It is thus seen that selected ones of the circuits which may be formed as part of the circuitized substrate shown in FIG. 4 may include one or more capacitors formed in accordance with the teachings herein as part thereof. Several combinations are possible.

The circuitized substrate of FIG. 4 is adapted for use in many environments, including as part of an information handling system, e.g., a personal computer, mainframe computer or a computer server. Such a final system may include more than one such substrate.

Figure 5:
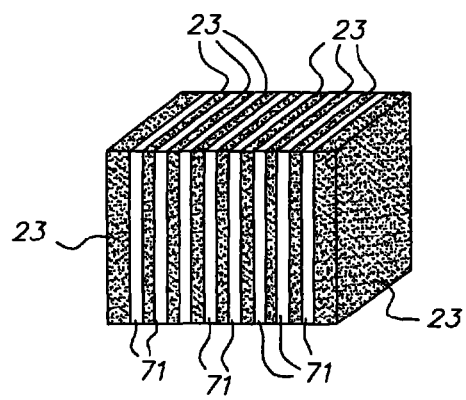
FIG. 5 is a perspective view of another embodiment of a capacitor structure which may be formed using the teachings of the present invention.

The perspective view of FIG. 5 is provided to illustrate that the layer of capacitive dielectric material may be much thicker than as defined and shown above, including to the extent that several individual capacitive plates 71 (electrodes) may be formed. The capacitive dielectric material, also of individual plate-like construction, is referenced by the numerals 23. In this embodiment, the capacitive material is deposited (formed) atop the underlying dielectric (not shown in FIG. 5) in the same manner as in FIG. 1, but to a much greater thickness. In this embodiment, the thickness may be from about one micron to about 2500 microns. Laser ablation, including the above laser, is used to form the deeper channels in material 23, following which the conductive material (preferably the same copper or copper alloy as used for conductive material 41) is then deposited, also preferably using one or more of the above processes (sputtering, electro-less and electroplating).

The result is the formation of the parallel plates 71 of conductive material. In this example, each plate 71 may have a thickness of from about 0.1 micron to about 100 microns, with length and width dimensions of from about one mil to about 1000 mils. Understandably, the invention is not limited to these dimensions, materials and processes. As in the substrate above, a second dielectric layer (not shown) is then added atop the FIG. 5 structure, which, when combined with the underlying dielectric and several capacitive plates, will form a substrate having an internal capacitor as part thereof. Electrical connections to the respective plates are possible using conventional processes, including the formation of thru-holes, external plating, etc. In FIG. 5, plate 71 can be considered a line if deposited on a surface, or a plate if it is deposited between two plates, such as capacitive dielectric plates 23.

Figure 6:
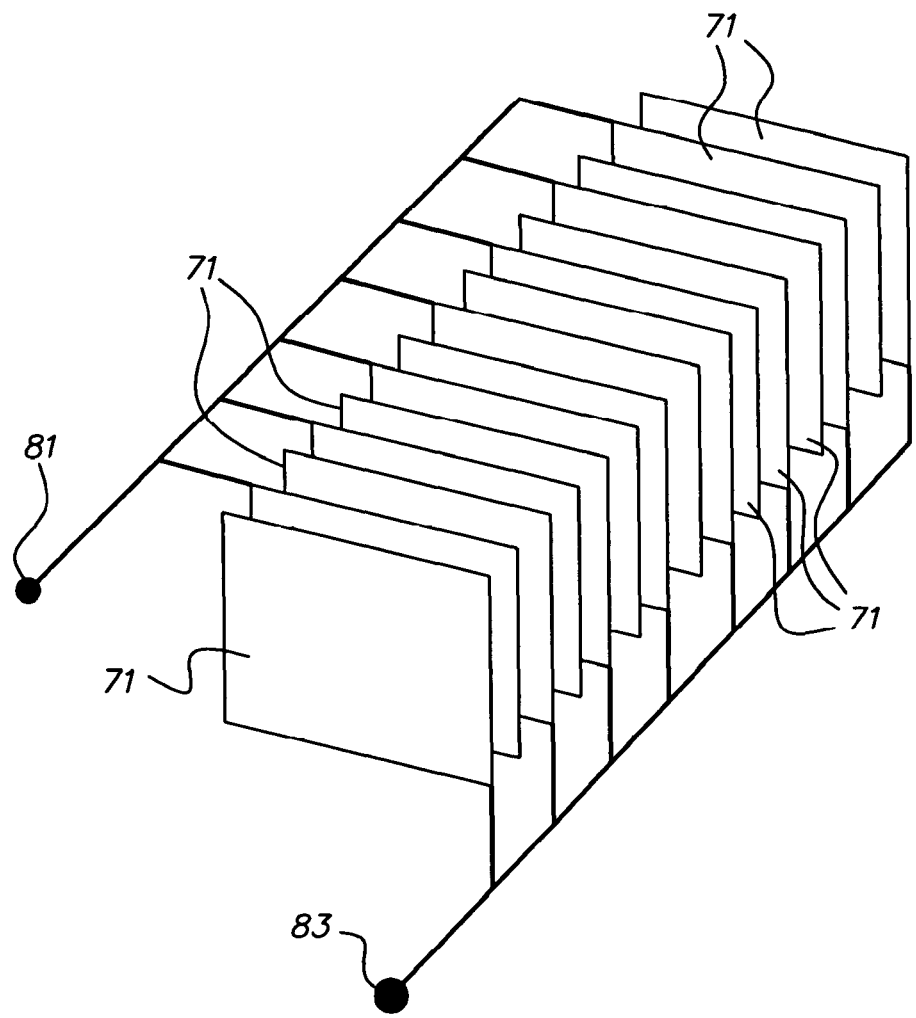
FIG. 6 is a perspective schematic view illustrating one arrangement of capacitor plates in forming an internal capacitor according to one embodiment of the invention.

FIG. 6 represents a schematic view of a structure such as that shown in FIG. 5, with suitable electrical connections being made to the spaced plates. The result, as shown, is the formation of several individual pairs of spaced conductor plates, with those of one part being commonly coupled to a contact 81 and those of another coupled to a contact 83. It is also possible that spaced plates 71 can be connected to conductive lines, with those of one branch being commonly coupled to a contact 81 and those of another branch coupled to a contact 83. Contacts 81 and 83 can be lines or plates, depending on final requirements. The total capacitance of this structure will be the sum of the capacitances of each of the capacitors formed by the individual electrode pairs. In FIG. 6, a total of fourteen such capacitors, or electrode pairs, are shown.

Figure 7A:
FIGS. 7a through 7e are side elevational views, in section, showing a method of forming a plurality of capacitors on a dielectric layer according to an alternate embodiment of the invention.
Figure 7B:

FIGS. 7a through 7e illustrate yet another approach to forming a capacitor structure in accordance with the teachings herein. In FIG. 7a, a layer of capacitive dielectric material 23 such as that used above in the embodiment of FIG. 1 is bonded onto a carrier sheet 85, preferably of copper or copper alloy and having a thickness of about 2 mils. Bonding is preferably accomplished by lamination but may be achieved by other means. In FIG. 7b, a dielectric layer 21, possibly of the same as layer 21 in FIG. 1, is provided and a layer 87 of conductive material is provided thereon. Layer 87 is preferably copper or copper alloy and bonded onto layer 21 using lamination processing such as used in conventional PCB manufacturing.

Figure 7C:
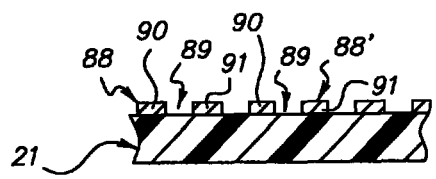
Figure 7D:
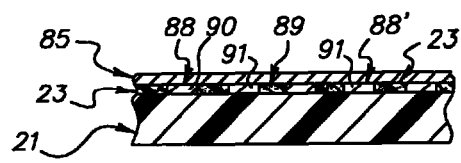
Figure 7E:
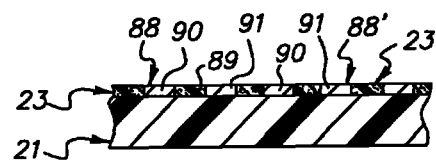

Layer 87 may be formed using other means. In one embodiment, layer 87 is about 4 mils thick. In FIG. 7c, layer 87 is subjected to conventional photolithographic processing (also discussed briefly above) used in known PCB circuitization procedures (e.g., a layer of photo-resist is applied, a mask aligned over the resist and the resist exposed, following which the resist is developed, leaving a pattern of exposed portions on the underlying layer 87). Etching is then conventionally used to remove desired parts of previously solid layer 87, resulting in the formation of a pattern, in this case one including spaced-apart channels 89, each channel 89 is of a comb-like shape, having projecting portions 88 and 88', respectively, with the projecting portions being oriented in an alternating pattern as shown, similar in shape to those formed in FIG. 2. Alternative channel patterns may of course be formed. The structure of FIG. 7a is then aligned above the FIG. 7c structure, with material 23 facing down, and the two structures bonded together, preferably using conventional PCB lamination, as shown in FIG. 7d. In this particular embodiment, the lamination may be achieved at a temperature within the range of from about 180 degrees C. to about 195 degrees C. and at a pressure of from about 450 PSI to about 550 PSI, for a time period of from about 100 to about 140 minutes. In one more specific example, a pressure of 500 PSI, temperature of 188 degrees C. and a time period of two hours may be used.

As can be seen in FIGS. 3, 3c, and 7c, the combination of dielectric layer 21 and spaced-apart channels 89 in capacitive dielectric material 23 results in a larger surface area as compared to a simple planar dielectric. The larger surface area can subsequently be covered by using sputtering or any other physical deposition of a conductor-dielectric-conductor combination to produce a capacitor. For example, in FIG. 7c, a thin conductor such as Cu, is sputtered using a physical mask on the entire surface including 88, 89, 90, 91, and 88' and subsequently a dielectric (silica, alumina etc) sputtered over the conductors and then another conductor, again such as Cu, sputtered on top of the dielectric to form a capacitor structure. It is possible to repeat this conductor-dielectric-conductor combination several times using a physical mask to fill the channels.

In one example, the process is repeated 100 times, with alternate conductors such as 1, 3, 5, 7 being larger in one direction and the other conductors, such as 2, 4, 6, 8 being larger in the opposite direction. The direction of the larger conductors allows the connection of the conductors to their respective electrode for the application or removal of energy. The dielectric layer can be larger than the conductors and cover entire electrode. Alternate conductors can be connected by plated through holes (PTH) to form multilayer capacitors. A variety of conductors including Cu, Ni, Ag, Au, Pt, Cr, Al can be used. Thickness of thin conductors and thin dielectric layers can be in the range of 0.1 micron to 10 microns. The capacitive dielectric layer may be made from a low dielectric constant material. A variety of dielectric materials including barium titanate, substituted barium titanate, strontium titanate, lead titanate, lead zirconate titanate, substituted lead zirconate titanate, lead magnesium niobate, lead zinc niobate, lead iron niobate, solid solutions of lead magnesium niobate and lead titanate, solid solutions of lead zinc niobate and lead titanate, lead iron tantalite, other ferroelectric tantalates, and combinations or mixtures thereof can be used.

The following Table illustrates some of the capacitance values attainable for vertically oriented capacitors within one square inch of surface area and of the configuration shown in FIGS. 5 and 6, using the capacitive dielectric materials defined above. This assumes a capacitive dielectric material having a dielectric constant of 30 for all examples. Values are in nano-Farads per square inch.

TABLE

| Capacitive layer | Vertical multilayer capacitors (C = C1 + C2 + C3 + ... + Cn) | | |
|---|---|---|---|
| thickness (mils) | 1 mil line, 1 mil space | 0.5 mil line, 0.5 space | 0.25 mil line, 0.25 mil space |
| 1 mil | 3.37 nF/inch$^2$ | 13.49 nF/inch$^2$ | 53.98 nF/inch$^2$ |
| 2 mils | 6.74 nF/inch$^2$ | 26.98 nF/inch$^2$ | 107.96 nF/inch$^2$ |
| 4 mils | 13.48 nF/inch$^2$ | 53.96 nF/inch$^2$ | 215.92 nF/inch$^2$ |

The above values are determined using the following equation: $C = ££_0 A/d$, where C=capacitance (farad).
A=cross sectional area (meter$^2$).
d=distance between two channels (spacing) in meters.
£=dielectric constant.
$£_0 = 8.854 \times 10^{-12}$ F/meter.

As an example of the high density attainable using the teachings herein, using 0.25 mil line and 0.25 mil spacing can accommodate approximately 2000 capacitors per square inch of area. Cross sectional area (A) and spacing (d) is important for a capacitive material to get maximum capacitance density. Thicker capacitive material with minimum spacing will produce higher capacitance which is opposite to normal capacitors. Normal capacitors show lesser capacitance for thicker capacitive material. For example, capacitance density of 2 mils and 4 mils thick capacitive materials (dielectric constant 30) is 3.37 nF/inch$^2$ and 1.68 nF/inch$^2$, respectively, when use as a normal capacitor with top and bottom electrode. Table 1 show capacitance density increases with increasing thickness of capacitive materials.

The table also suggests that it is possible to generate a high enough capacitance without a special capacitance layer. Any dielectric layer can produce high enough capacitance for finer lines and space structures. For example, 4 mils thick low dielectric constant (e.g. dielectric constant 3) material can produce 21.59 nF/inch$^2$ capacitance for 0.25 mil lines and 0.25 mil spaces. This indicates that it is possible to generate capacitance from any substrate without special capacitance layer.

The table further shows a trend in capacitance change. The total capacitance for vertical multilayer capacitors within a one square inch area of 2 mils capacitive dielectric layer thickness and dielectric constant 30 will be 6.74 nF, 26.98 nF, and 107.96 nF for 1 mil line-1 mil space, 0.5 mil line-0.5 mil space, 0.25 mil line-0.25 mil space, respectively; while a total capacitance within one square inch area of a normal capacitor having 2 mils capacitive dielectric layer thickness and dielectric constant 30 will be 3.37 nF.

Similarly, total capacitance for a vertical multilayer capacitor within one square inch area of 4 mils capacitive dielectric layer thickness and dielectric constant 30 will be 13.48 nF, 53.96 nF, 215.92 nF for 1 mil line-1 mil space, 0.5 mil line-0.5 mil space, 0.25 mil line-0.25 mil space respectively; while a total capacitance within a one square inch area of a normal capacitor having 4 mils capacitive dielectric layer thickness and dielectric constant 30 will be 1.68 nF. Therefore, total capacitance for vertical multilayer capacitors within a unit area will be inversely proportional to the square of the dimensions of the lines and spaces, and a total capacitance for vertical multilayer capacitors within a unit area will be proportional to the capacitive dielectric thickness, such that for vertical multilayer capacitors.

Total capacitance $\alpha D/L^2$

Total capacitance $= C_0 D/L^2$;

where
D=dielectric layer thickness
L=number of channels−1
$C_0$=constant
$C_0$=nlC1
n=total number of capacitors per unit volume
l=length of capacitor (in mils)
C1=capacitance per unit volume (mil$^3$), a function of the capacitive dielectric material, such that
$C_0 = 500{,}000 \times C1$ for 1 square inch and $80{,}000 \times C1$ for 1 square cm.
C1 is constant for a given materials.
$C1 = 0.000025 ££_0$
£=dielectric constant for a given materials.
$£_0 = 8.854 \times 10^{-12}$ F/meter.

According to the teachings of the instant invention, it is thus possible to vary the capacitance values of the capacitors formed by varying the thicknesses of the capacitance dielectric materials and/or the materials themselves. This represents a significant aspect of this invention because it enables the substrate manufacturer to meet the operational requirements of many circuit designs by simply providing different capacitance dielectric materials and/or modifying the thicknesses thereof as well as the size of the individual plates used for the capacitor electrodes. A further significant aspect of the invention is that the capacitors formed may be connected to each other with the plated thru holes and/or circuit features on the conductor layers. These connections can be either series or parallel connections. Thus, with the various electrode sizes, dielectric materials and thicknesses, an infinite number of capacitor values can be achieved in a single substrate.

The following Examples represent various combinations of capacitor dielectric materials and processes used to form capacitors according to various aspects of the invention. These are understood to be examples only and not limiting of the scope of this invention.

EXAMPLE ONE 38.5 grams (gm) of epoxy novolac resin (e.g., one sold under product designation "LZ 8213" by Huntsman, having a business location at 500 Huntsman Way, Salt Lake City, Utah) containing about 35 percent by weight methyl ethyl ketone, and catalyzed with about 0.015 parts per hundred (PPH) of 2-methyl-imidazole and 12.8 gm of a high molecular weight, reactive thermoplastic phenoxy resin (e.g., the aforementioned one sold under the product name "PKHS-40" by the InChem Corporation) containing 60 percent by weight methyl ethyl ketone, were mixed together with 100 gm of barium titanate (BaTiO$_3$) powder (available from Cabot Corporation, having a business location in Boyertown, Pa.). The barium titanate powder included a mean particle size of 0.12 microns and a surface area of 8.2 m$^2$/gm. Also, this composition may have been mixed with 20 gm of methyl ethyl ketone. The composition was then ball milled for one day, after which a thin coating of this well dispersed composition was deposited on a dielectric substrate layer and dried at about 130 degrees C. for three minutes in a standard convection oven. This heating for this time period served to substantially remove all residual organic solvents, while not adversely affecting the substrate. Following removal and cooling to room temperature, the coating then exhibited substantially no flaking. Channel formation and copper deposition then followed in a manner as defined herein.

EXAMPLE TWO 50 gm of epoxy novolac resin (e.g., the "LZ 8213" above by Huntsman, containing about 35 percent by weight methyl ethyl ketone and catalyzed with about 0.015 PPH of 2-methyl-imidazole, and 19.2 gm of the high molecular weight, reactive thermoplastic phenoxy resin "PKHS-40" (containing 60 percent by weight methyl ethyl ketone), were mixed together with 111 gm of barium titanate ($BaTiO_3$) powder from Cabot Corporation having the same mean particle size and surface area as in Example One (0.12 microns and 8.2 $m^2$/gm, respectively). Also, this composition may have been mixed with 20 gm of methyl ethyl ketone. As also in Example One, the composition was then ball milled for one day. A thin coating of the composition was then be deposited on a dielectric substrate layer and dried at about 130 degrees C. for three minutes in a standard convection oven. As in Example One, this heating served to substantially remove all residual organic solvents. Following removal and cooling to room temperature, the coating exhibited substantially no flaking. Channel formation and copper deposition then followed in a manner as defined herein.

EXAMPLE THREE 50 gm of epoxy novolac resin (e.g., the "LZ 8213" above by Huntsman), containing about 35 percent by weight methyl ethyl ketone and catalyzed with about 0.015 PPH of 2-methyl-imidazole, and 19.2 gm of the high molecular weight, reactive thermoplastic phenoxy resin "PKHS-40" (containing 60 percent by weight methyl ethyl ketone), were mixed together with 111 gm of barium titanate ($BaTiO_3$) powder from Cabot Corporation having the same mean particle size and surface area as in Example One (0.12 microns and 8.2 $m^2$/gm, respectively). Also, this composition may be mixed with 20 gm of methyl ethyl ketone. As also in Example One, the composition was then be ball milled for one day. Approximately a 25 micron thick coating of the composition was then deposited on a two-ounce smooth Cu foil (carrier sheet) and dried at about 130 degrees C. for three minutes in a standard convection oven. As in Example One, this heating served to substantially remove all residual organic solvents. Following cooling to room temperature, the coating exhibited substantially no flaking. The coating and copper carrier subassembly were then laminated (e.g., at from about 180 degrees C. to about 200 degrees C. for about two hours at a pressure of from about 300 to about 500 PSI against a dielectric layer-copper patterned structure as shown in FIG. 7C. The heat from this process may cause the capacitive dielectric material to flow into some parts of the copper channel pattern to fill any gaps present. Following lamination, the copper carrier sheet was removed (e.g., peeled off) from the laminated structure.

EXAMPLE FOUR 91.5 gm of an epon resin sold under the product name "Epon SU-8" (a polymer-based negative resist sensitive to near-UV radiation, available from Shell Chemical, having a business location at Houston, Tex.), containing about fifty percent by weight methyl ethyl ketone and 51.5 gms of cycloaliphatic epoxy sold under the product name "ERL-4221" (available from the Union Carbide Corporation, having a business location at Danbury, Conn.) and 84 gms of a phenoxy resin sold under the product name "PKHC" (available from Phenoxy Associates, Rock Hill, S.C.), containing 50 wt % methyl ethyl ketone were mixed together with 93 gm of Diglycidyl ether of tetrabromobisphenal A sold under the product name "Araldite 9302" (available from ciba products company, having a business location at Hawthorne, N.Y.), containing about seventy-two percent by weight solids and ball milled for three days. After ball milling, a homogeneous mixed solution was observed. 93 gm of this solution was mixed with 100 gm of barium titanate (BaTiO3) powder (50 gm BaTiO3 with mean particle size=0.065 micron, surface area=16 m2/gm) and 50 gm BaTiO3 with mean particle area=0.12 micron, surface area=8.2 m2/gm) and 15 gm titanium dioxide ($TiO_2$) powder available from Degussa and ball milled for five days. Then, about 4.5 gm of triallylsulfoniumhexafluoroantimonate salt was mixed into the mixed solution and additionally ball milled for another one hour. A thin film of this mixed composite was then deposited on a copper substrate and dried at approximately 120 degrees C. for ten minutes in an oven to remove residual organic solvents. The film was radiated with ultraviolet light through a photo-mask for a time period of from about 200 to about 300 seconds using a Xenon arc lamp (alternatively, laser direct imaging may be used), followed by developing the film in polypropylene carbonate. The developed features were then dried at approximately 140 degrees C. for three minutes in an oven to remove residual organic solvents. This was followed by curing in an oven at 190 degrees C. for about two hours. This Example Four illustrates one embodiment of a photo-imageable capacitive material usable in the present invention, including one in which the comb-like patterns of channels may be readily formed using the described photo processing.

EXAMPLE FIVE

Ten gm of poly methyl methacrylate, also known as PMMA (and having a glass transition temperature of about 105 degrees C.), was mixed with about thirty gm of tetra hydro furan (also known as THF) and 1.5 gm of barium titanate ($BaTiO_3$) powder. The mixed solution was stirred for a time period of from about twenty-four to about thirty-six hours to assure uniform mixing. A thin layer of this mixed solution was deposited onto a copper carrier sheet and dried slowly at room temperature (to avoid cracking in the film). A silicon dioxide mold containing comb-like features was pressed onto the formed film layer at around 150 degrees Celsius and 600 PSI for a time of 30 minutes. The resulting structure was then allowed to cool to room temperature. The mold was thereafter separated from the now patterned structure. This process, referred to above as an imprinting process, allows the formation of extremely fine channels, including those having a width of only about 0.2 micron.

Thus there has been shown and described a method of making a circuitized substrate which includes at least one (and possibly several) internal capacitors as part thereof. As defined herein, such capacitors may be of extremely small size, thus making these readily usable in highly miniaturized circuit patterns in such high demand today. Differing levels of capacitance are relatively easily provided using the teachings herein. Also of importance, the method defined herein may be performed, for the most part, using many conventional PCB processes to thereby reduce costs. The resulting substrate may also be incorporated into a larger, multilayered structure if desired, including one with more capacitive substrates as part thereof. Such incorporation is possible also using conventional PCB processing, in this case simple lamination at established pressures and temperatures. There have also been defined examples of capacitor materials which may be used. The invention as defined herein, if desired, is capable of transmitting both regular and high speed (frequency) signals, the latter at a rate of from about one Gigabit/sec to about forty Gigabits/second and even higher, while substantially preventing impedance disruption. Of further significance, the invention is able to utilize thru-holes of very fine definition and is able to assure highly dense circuit patterns, all of which are deemed extremely important to many of today's products using such substrates.

While there have been shown and described what at present are considered the preferred embodiments of the invention, it will be obvious to those skilled in the art that various changes and modifications may be made therein without departing from the scope of the invention as defined by the appended claims.

Since other combinations, modifications and changes varied to fit particular environments will be apparent to those skilled in the art, the invention is not considered limited to the chosen preferred embodiments for purposes of this disclosure, but covers all changes and modifications which do not constitute departures from the true spirit and scope of this invention.

Having thus described the invention, what is desired to be protected by Letters Patent is presented in the subsequently appended claims.

What is claimed is:

1. A method of making a circuitized substrate including at least one internal capacitor, said method comprising:
   providing a first, single dielectric layer depositionally processed in a single step;
   providing a capacitive dielectric layer on said first, single dielectric layer, said capacitive dielectric layer containing nano-particles of a ferroelectric ceramic material dispersed in a polymer matrix and having a thickness less than 2500 microns;
   forming at least two pairs of spaced-apart, longitudinal, planar channels by a subtractive process, said at least two pairs of spaced-apart, longitudinal, planar channels extending up to the thickness of said capacitive dielectric layer, said at least two pairs of spaced-apart, longitudinal, planar channels having parallel side walls within said capacitive dielectric layer;
   depositing electrically conductive material in a single step within each of said at least two pairs of spaced-apart longitudinal, planar channels, forming at least two parallel plates of electrically-conductive channels; and
   providing a second single dielectric layer over said electrically conductive material to form said circuitized substrate having at least one internal capacitor, said internal capacitor having as a thickness a distance between said at least two parallel plates of electrically-conductive channels of said capacitive dielectric layer, a total capacitance of said internal capacitor within a unit area increasing with decreasing dimensions between said at least two parallel plates of electrically-conductive channels and spaces of said capacitive dielectric therebetween, and the total capacitance of said internal capacitor within said unit area increasing as the thickness of the capacitive dielectric layer increases in accordance with the parameters:

$$\text{total capacitance} = C_0 D/L^2;$$

where
D=dielectric layer thickness
L=number of channels−1
$C_0$=constant
$C_0$=nlC1
n=total number of capacitors per unit volume
l=length of capacitor (in mils)
C1=capacitance per unit volume (mil$^3$), a function of the capacitive dielectric material, such that
$C_0$=500,000×C1 for 1 square inch and 80,000×C1 for 1 square cm.
C1 is constant for a given material
C1=0.000025 ££$_0$
£=dielectric constant for a given material
£$_0$=8.854×10$^{-12}$ F/meter.

2. The method of claim 1, wherein said capacitive dielectric layer is coated onto said first, single dielectric layer.

3. The method of claim 1, wherein the material of said capacitive dielectric layer comprises a thermosetting resin and a high molecular mass flexibilizer, said capacitor material not including continuous or semi-continuous fibers as part thereof.

4. The method of claim 3, wherein said thermosetting resin is selected from a group consisting of epoxy resin, high temperature diglycidyl ether, polyimide, cyanate ester triazines, bismaleimide, bismaleimide and epoxy modified blend, benzoxazine, epoxy modified benzoxazine, halogen free benzoxazine, fluoropolymer, benzocyclobutene, perfluorobutane, polyphenylenesulfide, polysulfone, polyetherimide, polyetherketone, polyphenylquinoxaline, polybenzoxazole, polyphenyl benzobisthiazole and combinations thereof.

5. The method of claim 4, wherein said high molecular mass flexibilizer is selected from a group consisting of phenoxy resin, oligomeric resin and polymeric resin.

6. The method of claim 5, wherein said ferroelectric ceramic material is selected from a group consisting of barium titanate, substituted barium titanate, strontium titanate, lead titanate, lead zirconate titanate, substituted lead zirconate titanate, lead magnesium niobate, lead zinc niobate, lead iron niobate, solid solutions of lead magnesium niobate and lead titanate, solid solutions of lead zinc niobate and lead titanate, lead iron tantalite, other ferroelectric tantalates, and combinations or mixtures thereof.

7. The method of claim 1, wherein said forming of said at least two pairs of spaced-apart, longitudinal, planar channels within said capacitive dielectric layer is accomplished using a laser for laser ablation.

8. The method of claim 7, wherein the laser utilized to accomplish said laser ablation is a Nd:YAG laser.

9. The method of claim 1, wherein said depositing of said electrically conductive material is accomplished using a process selected from the group of processes consisting of electro-plating, electroless plating, sputtering, and combinations thereof.

10. The method of claim 1, wherein said providing of said second, single dielectric layer is accomplished using a lamination process.

11. The method of claim 1, further including chemically polishing said capacitive dielectric layer having said electrically conductive material therein prior to said providing of said second, single dielectric layer.

12. The method of claim 1, wherein a number of said at least two pairs of spaced-apart, longitudinally, planar channels is two, each being formed in a comb-like pattern including a plurality of projecting portions, said projecting portions of one of said channels being oriented in an alternating manner relative to said plurality of projecting portions of the other of said channels.

13. The method of claim 1, further including bonding additional dielectric layers and additional electrically conductive layers to said substrate.

14. The method of claim 1, wherein said materials of said capacitive dielectric layer comprise materials selected from the group of: barium titanate, substituted barium titanate, strontium titanate, lead titanate, lead zirconate titanate, substituted lead zirconate titanate, lead magnesium niobate, lead zinc niobate, lead iron niobate, solid solutions of lead magnesium niobate and lead titanate, solid solutions of lead zinc niobate and lead titanate, lead iron tantalite, other ferroelectric tantalates, and combinations or mixtures thereof.

15. A method of making a circuitized substrate including at least one internal capacitor, said method comprising:
   providing a first, single dielectric layer depositionally processed in a single step;
   providing a capacitive dielectric layer on said first, single dielectric layer, said capacitive dielectric layer containing nano-particles of a ferroelectric material dispersed in a polymer matrix and having a thickness less than 2500 microns;
   forming at least two pairs of spaced-apart, longitudinal, planar channels by a subtractive process, said at least two pairs of spaced-apart, longitudinal, planar channels extending up to the thickness of said capacitive dielectric layer, said at least two pairs of spaced-apart, longitudinal, planar channels having parallel side walls within said capacitive dielectric layer, a first pair of said at least two pairs of spaced-apart longitudinal, planar channels having a first and a second channel; a second pair of said at least two pairs of spaced-apart, longitudinal, planar channels being positioned within a space between said first and said second channels of said first pair of said at least two pairs of spaced-apart longitudinal, planar channels; said first channel of said first pair of said at least two pairs of spaced-apart longitudinal, planar channels being connected with said second channel of said first pair of said at least two pairs of spaced-apart longitudinal, planar channels and said first channel of said second pair of said at least two pairs of spaced-apart longitudinal, planar channels being connected with said second channel of said second pair of said at least two pairs of spaced-apart longitudinal, planar channels;
   depositing electrically conductive material in a single step within each of said at least two pairs of spaced-apart, longitudinal, planar channels, forming at least two parallel plates of electrically-conductive channels; said first and second channels of said at least two pairs of spaced-apart longitudinal, planar channels forming a capacitor member; and
   providing a second single dielectric layer over said electrically conductive material to form said circuitized substrate; forming said internal capacitor whose said first and said second channels of said first and said second of said at least two pairs of at least two parallel plates of electrically-conductive channels are connected to pads disposed on said second single dielectric layer, a total capacitance of said internal capacitor within a unit area increasing with decreasing dimensions between said at least two parallel plates of electrically-conductive channels and spaces of said capacitive dielectric therebetween, and the total capacitance of said internal capacitor within said unit area increasing with increasing capacitive dielectric layer thickness in accordance with the parameters:

$$\text{total capacitance} = C_0 D/L^2;$$

where
D=dielectric layer thickness
L=number of channels−1
$C_0$=constant
$C_0$=nlC1
n=total number of capacitors per unit volume
l=length of capacitor (in mils)
C1=capacitance per unit volume ($\text{mil}^3$), a function of the capacitive dielectric material, such that
$C_0$=500,000×C1 for 1 square inch and 80,000×C1 for 1 square cm
C1 is constant for a given materials
C1=0.000025 $\varepsilon\varepsilon_0$
$\varepsilon$=dielectric constant for a given materials
$\varepsilon_0$=8.854×10$^{-12}$ F/meter.

16. The method of claim 15, wherein said first of at least two pairs of spaced-apart, longitudinal, planar channels is connected with a pad.

17. The method of claim 15, wherein said materials of said capacitive dielectric layer comprise materials selected from the group of: barium titanate, substituted barium titanate, strontium titanate, lead titanate, lead zirconate titanate, substituted lead zirconate titanate, lead magnesium niobate, lead zinc niobate, lead iron niobate, solid solutions of lead magnesium niobate and lead titanate, solid solutions of lead zinc niobate and lead titanate, lead iron tantalite, other ferroelectric tantalates, and combinations or mixtures thereof.

18. A method of making a circuitized substrate including at least one internal capacitor, said method comprising:
   providing a first, single dielectric layer depositionally processed in a single step;
   providing a capacitive dielectric layer having a plane on said first, single dielectric layer, said capacitive dielectric layer containing nano-particles of a ferroelectric ceramic material dispersed in a polymer matrix and having a thickness of no more than 2500 microns;
   forming at least two pairs each of at least two parallel plates of electrically-conductive channels by a subtractive process, said at least two pairs of spaced-apart, longitudinal, planar channels extending up to a thickness of said capacitive dielectric layer, said channels having parallel side walls within said capacitive dielectric layer;
   depositing electrically conductive material in a single step within each of said at least two pairs of spaced-apart, longitudinal, planar channels; and
   providing a second single dielectric layer over said electrically conductive material to form said circuitized substrate having at least one internal capacitor, forming said at least one internal capacitor whose first and second channels of a first and second of said at least two pairs of spaced-apart longitudinal, planar channels being connected, respectively, to pads disposed on said second single dielectric layer, a total capacitance of said electrically connected internal capacitors within a unit area increasing as the dimensions between said at least two parallel plates of electrically-conductive channels and spaces of said capacitive dielectric therebetween decreases, and the total capacitance of said internal capacitor within said unit area increasing as the thickness of the capacitive dielectric layer increases in accordance with the parameters:

$$\text{total capacitance} = C_0 D/L^2;$$

where
D=dielectric layer thickness
L=number of channels−1
$C_0$=constant
$C_0$=nlC1
n=total number of capacitors per unit volume
l=length of capacitor (in mils)
C1=capacitance per unit volume ($\text{mil}^3$), a function of the capacitive dielectric material, such that $C_0=500,000 \times C1$ for 1 square inch and $80,000 \times C1$ for 1 square cm.

C1 is constant for a given material $C1=0.000025 \; ££_0$

£=dielectric constant for a given material $£_0=8.854 \times 10^{-12}$ F/meter.

19. The method of claim 18, wherein said materials of said capacitive dielectric layer comprise materials selected from the group of: barium titanate, substituted barium titanate, strontium titanate, lead titanate, lead zirconate titanate, substituted lead zirconate titanate, lead magnesium niobate, lead zinc niobate, lead iron niobate, solid solutions of lead magnesium niobate and lead titanate, solid solutions of lead zinc niobate and lead titanate, lead iron tantalite, other ferroelectric tantalates, and combinations or mixtures thereof.

\* \* \* \* \*